(12) United States Patent
Tan et al.

(10) Patent No.: US 7,169,675 B2
(45) Date of Patent: Jan. 30, 2007

(54) MATERIAL ARCHITECTURE FOR THE FABRICATION OF LOW TEMPERATURE TRANSISTOR

(75) Inventors: Chung Foong Tan, Singapore (SG); Jinping Liu, Singapore (SG); Hyeokjae Lee, Singapore (SG); Kheng Chok Tee, Singapore (SG); Elgin Quek, Singapore (SG)

(73) Assignee: Chartered Semiconductor Manufacturing, Ltd, Singapore (SG)

( * ) Notice: Subject to any disclaimer, the term of this patent is extended or adjusted under 35 U.S.C. 154(b) by 14 days.

(21) Appl. No.: 10/886,442

(22) Filed: Jul. 7, 2004

(65) Prior Publication Data

US 2006/0006427 A1   Jan. 12, 2006

(51) Int. Cl.
*H01L 21/336* (2006.01)
(52) U.S. Cl. .................. 438/301; 438/303; 438/305
(58) Field of Classification Search ......... 438/275–308
See application file for complete search history.

(56) References Cited

U.S. PATENT DOCUMENTS

| 5,731,626 | A | 3/1998 | Eaglesham et al. | |
|---|---|---|---|---|
| 6,043,139 | A | 3/2000 | Eaglesham et al. | |
| 6,153,920 | A | 11/2000 | Gossmann et al. | |
| 6,268,640 | B1 * | 7/2001 | Park et al. | 257/607 |
| 6,335,233 | B1 * | 1/2002 | Cho et al. | 438/199 |
| 6,576,535 | B2 | 6/2003 | Drobny et al. | |
| 2003/0230784 | A1 * | 12/2003 | Iwata et al. | 257/401 |
| 2004/0077157 | A1 * | 4/2004 | Chakravarthi et al. | 438/510 |

OTHER PUBLICATIONS

Nishikawa, S., et al., "Reduction of transient boron diffusion in preamorphized Si by carbon implantation," Appl. Phys. Lett., 60(18), May 4, 1992.
King et al., "Defect evolution of low energy, amorphizing germanium implanted in silicon", Journal of applied physics, vol. 93, #5, Mar. 2003, pp. 2449=-2452.
Nishikawa et al., "Elimination of secondary defects in preamorphized Si by C+ implantation", appl. phys. Lett 62 (3) Jan. 18, 1993, pp. 303-305.
Nado, Indium segregation into dislocation loops induced by ion implanted damage in Si, journal of applied physics v. 93, #3, Feb. 1, 2003, pp. 1428-1431.

* cited by examiner

*Primary Examiner*—H. Jey Tsai
(74) *Attorney, Agent, or Firm*—William J. Stoffel

(57) ABSTRACT

A structure and method for forming a carbon-containing layer in at least a portion of the end of range regions of implanted PAI and/or doped regions. The C-containing layer/region getters defects from the implanted PAI region or doped region. Example embodiments show a C-containing layer under at FET. Other example embodiments show an implanted C-containing regions implanted into the EOR region of implanted doped regions, such as pocket regions, S/D regions and SDE regions. Low temperature anneals can be used because the carbon-containing layer reduces defects.

49 Claims, 22 Drawing Sheets

S/D EOR in C-layer

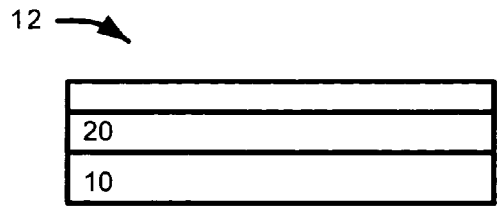
FIGURE 2B
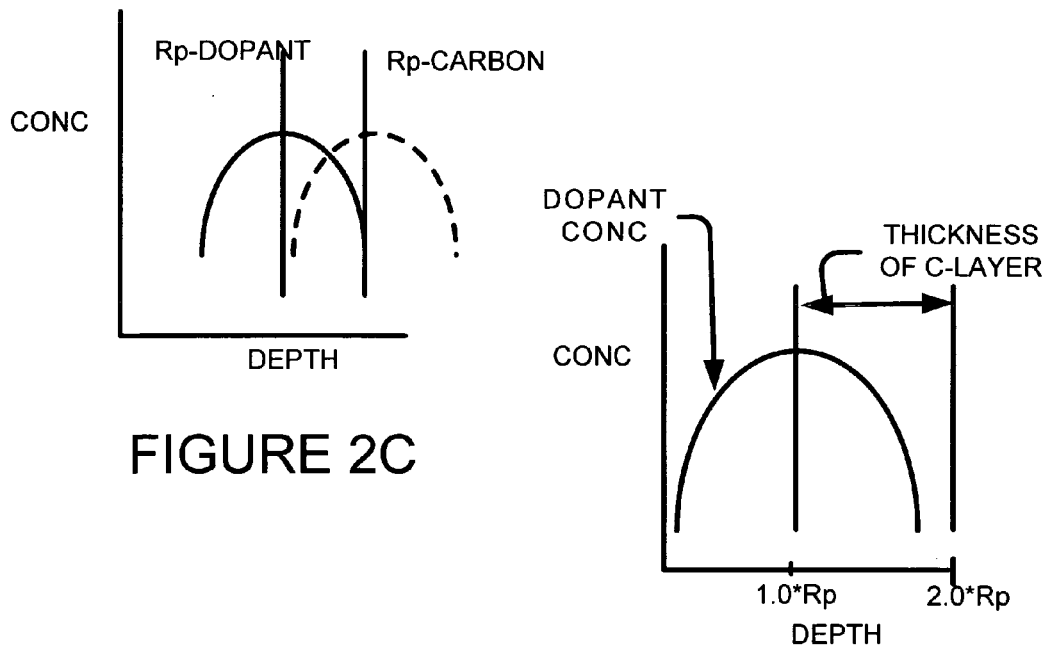
FIGURE 2C
FIGURE 2C-1
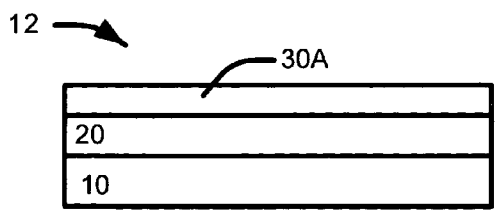
FIGURE 2D

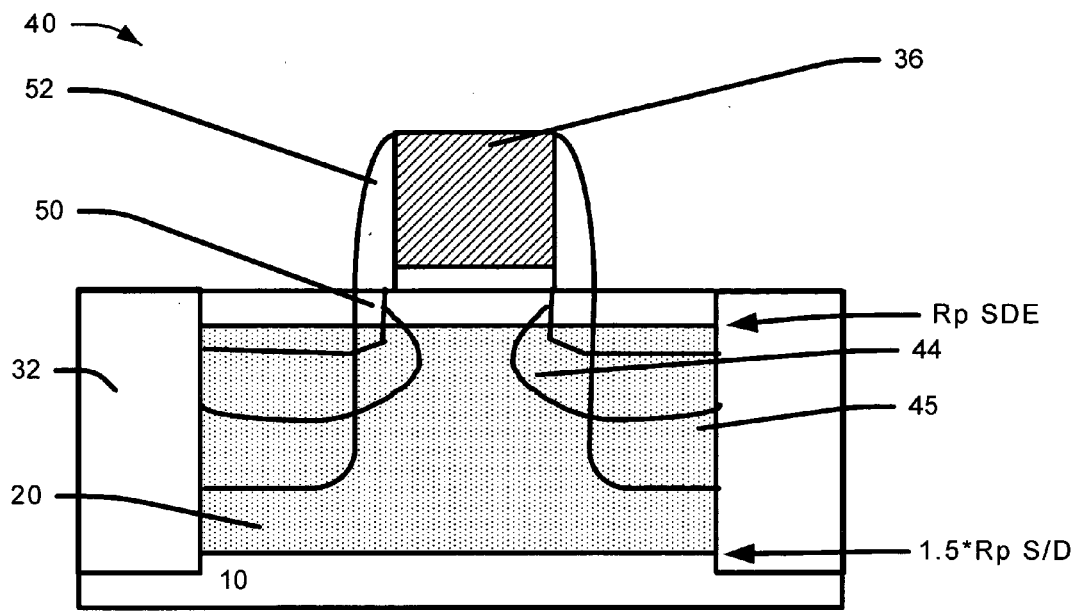
FIGURE 2H
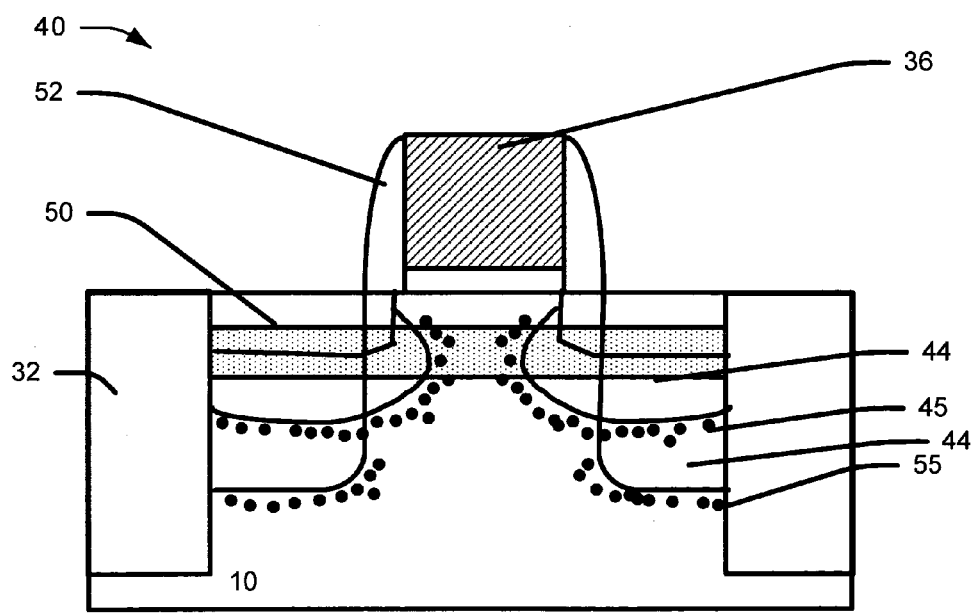
FIGURE 3A - SDE EOR in C-layer

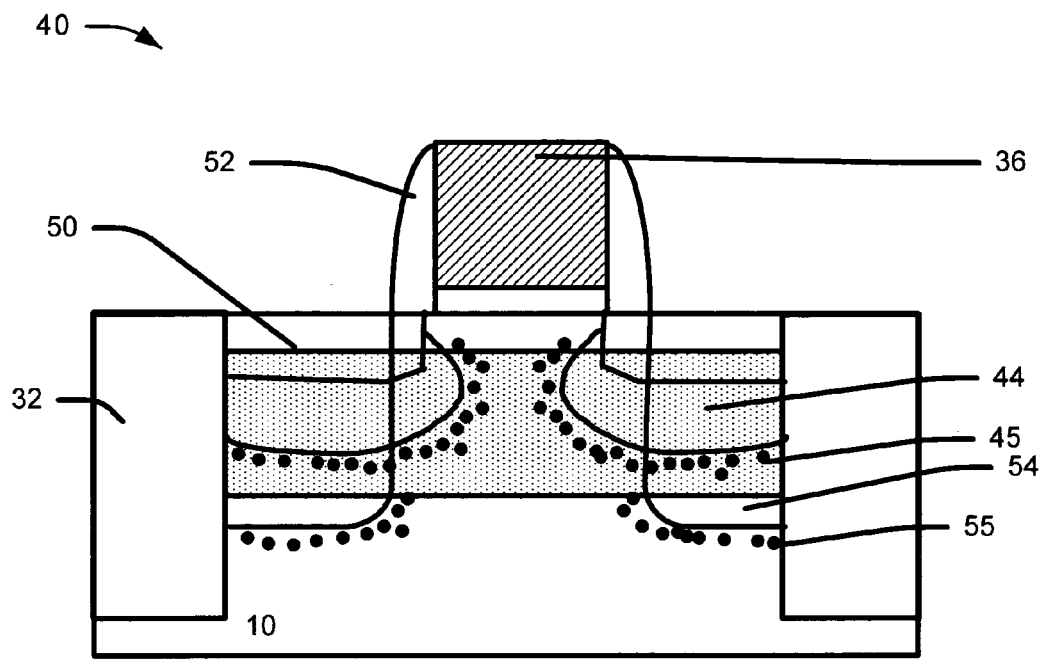
FIGURE 3B - POCKET EOR in C-layer
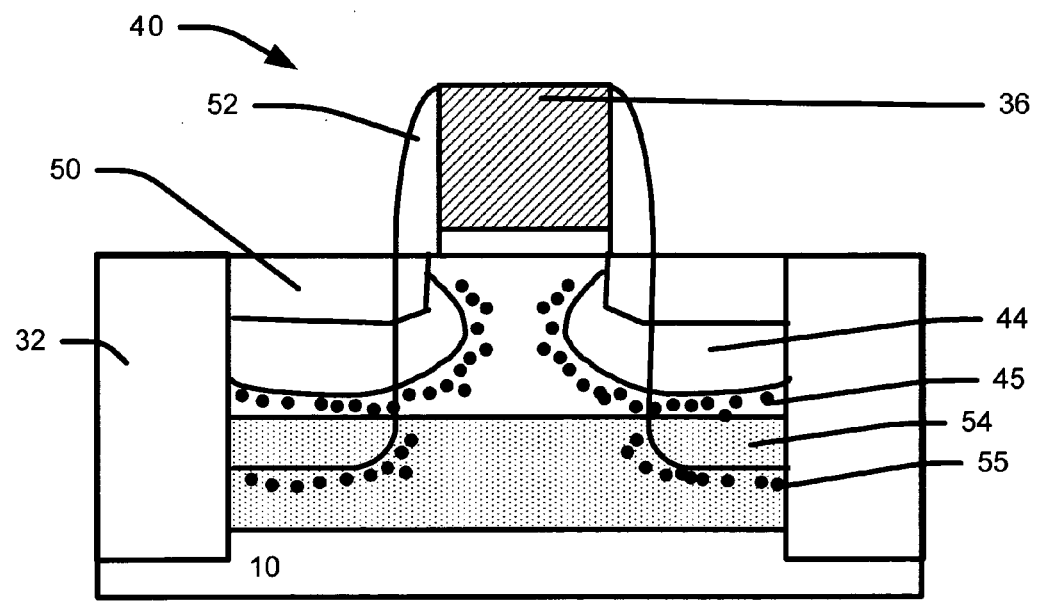
FIGURE 3C - S/D EOR in C-layer

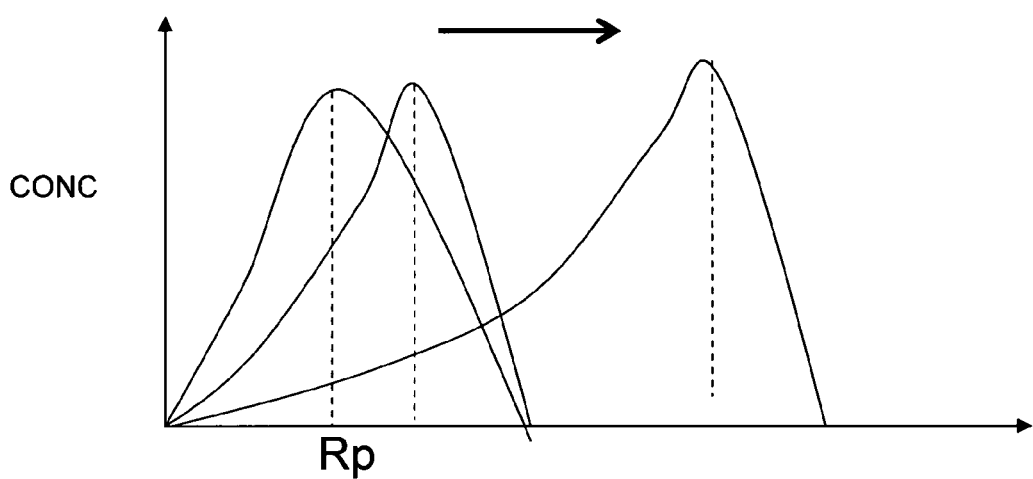
FIGURE 10 - PRIOR ART

MATERIAL ARCHITECTURE FOR THE FABRICATION OF LOW TEMPERATURE TRANSISTOR

BACKGROUND OF INVENTION

1) Field of the Invention

This invention relates generally to the structure and fabrication of a semiconductor device and more particularly to the fabrication of a carbon containing layer near doped regions in a transistor.

2) Description of the Prior Art

Semiconductor devices such as field effect transistors (FETs) have a source region, and a drain region formed in a semiconductor substrate and a gate formed over the channel region. The source and drain are formed in a semiconductor substrate by introducing impurities (dopants) into the substrate. The semiconductor body separates the source region and the drain region. The dopants used to form the source and drain regions are of a different polarity (n-type or p-type) than the semiconductor substrate body surrounding the source and drain regions. Consequently, substantially no current will pass from the source to the semiconductor body or from the drain to the semiconductor body.

There is a space-charge layer (or channel) which separates both the source region from the semiconductor body and the drain region from the semiconductor body.

The usual method of introducing dopant atoms is ion implantation. During ion implantation, dopant atoms are ionized, accelerated and directed at a silicon substrate. They enter the crystal lattice of the silicon substrate, collide with silicon atoms and gradually lose energy, finally coming to rest at some depth within the lattice. The average depth can be controlled by adjusting the acceleration energy. The dopant dose can be controlled by monitoring the ion current during implantation. The principal side effect—disruption of the silicon lattice caused by ion collisions—is removed by subsequent heat treatment, i.e., annealing. Annealing is required to repair lattice damage and place dopant atoms on substitutional sites within the silicon substrate where they will be electrically active. Rapid thermal annealing is a term that covers various methods of heating wafers for short periods of time, e.g., 100 seconds, which enable almost complete electrical activation with diffusion of dopant atoms occurring within what had been previously regarded as tolerable limits.

However, during the anneal, damage from the ion implantation process, in the form of point defects, migrates laterally from the source and/or drain and into the semiconductor body and enhances dopant diffusion. This enhanced diffusion, known as transient enhanced diffusion (TED) changes the carefully tailored profile in the body of the device.

Transient enhanced diffusion occurs during post-implant annealing and arises from the fact that the diffusion of dopant atoms, particularly boron (B) and phosphorus (P), is undesirably enhanced by excess silicon (Si) self-interstitials generated by the implant. The generation of excess Si self-interstitials by the implant also leads to a phenomenon herein referred to as dynamic clustering whereby implanted dopant atoms form clusters or agglomerates in a semiconductor layer. These clusters or agglomerates are immobile and electrically inactive.

Recent investigations have been aimed at untangling the mechanisms of dopant diffusion in order to provide a sound basis for simulation programs designed to predict dopant diffusion during device processing. An additional challenge is the development of processing-compatible methods of controlling the diffusion of dopant atoms.

The FIG. 10 shows a typical implant doping profile at different implantation energies. Rp which is the projected range of the implantation is measured from the surface of the substrate in to the maximum region where the dopant lies.

The more relevant technical developments in the patent literature can be gleaned by considering the following:

U.S. Pat. No. 6,153,920 Gossmann, et al. Nov. 28, 2000—Process for controlling dopant diffusion in a semiconductor layer and semiconductor device formed thereby.

U.S. Pat. No. 5,731,626 Eaglesham, et al and U.S. Pat. No. 6,043,139 Eaglesham, et al.—Process for controlling dopant diffusion in a semiconductor layer—Diffusion of ion-implanted dopant is controlled by incorporating electrically inactive impurity in a semiconductor layer by at least one crystal growth technique.

U.S. Pat. No. 6,576,535 Drobny, et al. Jun. 10, 2003—doped epitaxial layer.

Chung Foong Tan, Eng Fong Chor, Jinping Liu, Hyeokjae Lee, Elgin Quek, and Lap Chan, "Influence of substitutional carbon incorporation on implanted-indium-related defects and transient enhanced diffusion", Applied Physics Letters Vol. 83(20) pp. 4169–4171. Nov. 17, 2003.

Nishikawa, S., et al., "Reduction of transient boron diffusion in preamorphized Si by carbon implantation," Appl. Phys. Lett., 60(18), May 4, 1992.

King et al., "Defect evolution of low energy, amorphizing germanium implanted in silicon", Journal of Applied Physics, Vol. 93, # 5, March 2003, pp. 2449–2452.

Nishikawa et al., "Elimination of secondary defects in preamorphized Si by C+ implantation", Appl. Phys. Lett 62 (3) 18 Jan. 1993, pp. 303–305.

Noda, Indium segregation into dislocation loops induced by ion implanted damage in Si", Journal Of Applied Physics v. 93, # 3, 1 Feb. 2003, pp. 1428–1431.

SUMMARY OF THE INVENTION

Embodiments of the present invention provides a structure and a method of manufacturing a device which is characterized as follows.

An example embodiment is a method to form first and second regions and a carbon containing layer using implantation processes comprising:

forming a carbon containing layer in a substrate; said substrate comprised of crystalline structure including silicon;

implanting ions to form a first region and a first end-of-range region in the substrate; at least a portion of said first end-of-range region is in said carbon containing layer;

implanting ions to form a second region and a second end-of-range region in the substrate; at least a portion of said second region end-of-range region is in said carbon containing layer.

Another example embodiment is a semiconductor structure comprising:

first and second regions and a carbon containing layer comprising: a carbon containing layer in a substrate; said substrate comprised of crystalline structure including silicon;

a first region and a first end-of-range region in the substrate; said first end-of-range region is in said carbon containing layer;

a second region a second end-of-range region in the substrate; said second region end-of-range region is in said carbon containing layer.

Other example embodiments are defined in the claims and specification below.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1A-1 and 1A-2 show the formation of the doped or implanted region 104 and the carbon-containing layer 112 according to an example embodiments of the invention.

FIGS. 2A, 2B, 2C, 2C-1, 2D, 2E, 2F, 2G, and 2H show a method and structure according to an example embodiment of the invention.

FIGS. 3A, 3B, 3C show a method and structure where the C-containing layer is in different positions/depths according to example embodiments of the invention.

FIGS. 7B-1, 7B-2, 7B-3, and 7B-4 illustrate in general, an aspect of the example embodiment where we form an implanted C-containing region and a EOR region within the doped region. FIG. 7B-1 shows an implanted doped region and an EOR region. FIG. 7B-2 shows a rough concentration profile of an implanted region. FIG. 7B-3, shows we form a C-containing layer about in the projected region and the EOR region. FIG. 7B-4 shows a rough concentration profile of an implanted region.

FIG. 9A has a C-containing layer that reduced defects.

FIG. 10 shows a typical implant doping profile at different implantation energies according to the prior art.

DETAILED DESCRIPTION OF THE EXAMPLE EMBODIMENTS

The present invention will be described in detail with reference to the accompanying drawings. The example embodiments of the present invention provide structures and methods of forming a device having a carbon (C) containing layer. The embodiments below are examples and can be modified. The invention is defined by the claims.

I. OVERVIEW OF THE EXAMPLE EMBODIMENTS

Some major example embodiments comprise the following:

☐ embodiment—FET with carbon-containing layer between the Rp of a first implanted region to the bottom of the EOR region of a second implanted region at a lower depth than said first implanted region (e.g., FIG. 1-D).
☐ embodiment—FET with carbon-containing layer (e.g., FIG. 2H)
   a) (first aspect) carbon-containing layer formed by ion implant (e.g., FIGS. 2A–2D)
   b) (second aspect) carbon-containing layer formed by a growth process (e.g., FIGS. 4A–4B)
☐ embodiment—FET with carbon-containing layer and Strained region (e.g., FIGS. 5E–5H)
   a) first aspect—strained region formed by growth or cvd process. (e.g., FIGS. 5A–5D)
   b) second aspect—strained region formed by implant process. (e.g., FIG. 5E)
☐ embodiment—C-containing layer that is diffuses during an anneal to form a retrograde C concentration profile C-containing layer (e.g., FIGS. 6A–6D)
☐ embodiment—Implanted C-containing layers in the projected regions and EOR regions of implanted doped regions (E.g. S.D, SDE, Pocket regions). (e.g., FIG. 7A)

Figure 8A:
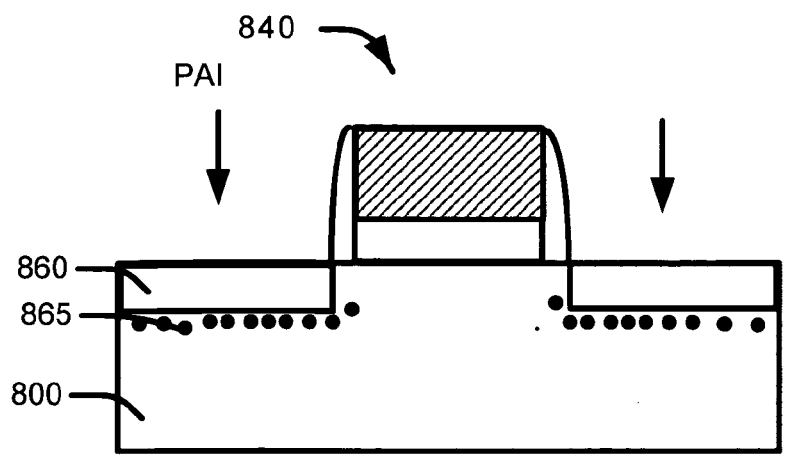
FIGS. 8A, 8B and 8C show an example embodiment where a C-containing layer is formed in the EOR of a pre-amorphization implant (PAI).
Figure 8B:
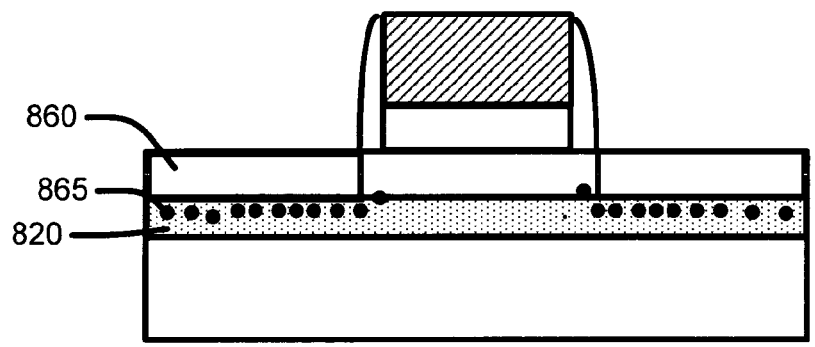
Figure 8C:
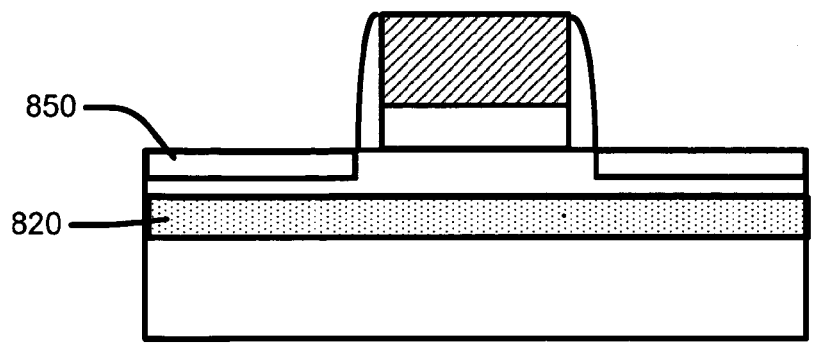

☐ embodiment—C-layer in EOR Regions of PAI regions (e.g., FIG. 8C)

These non-limiting example embodiments are explained in more detail below. Additional major example embodiments are also described in the specification and claims.

II. DEFINITIONS AND ABBREVIATIONS

The terms are defined and explained as follows:

c-layer—carbon containing layer carbon layer—carbon containing layer projected range (Rp) is the median depth of the implanted ions (before anneal).

EOR (end of range) region is a region typically below the Rp that contains defects from the ion implantation that creates an amorphous region. The location of the EOR region is highly depend on the implant process. An estimate of the region of the EOR defects location is the region between 1.0 Rp and 2.0 Rp, but does not have to extend totally between 1.0 Rp and 2.0 Rp. For larger implant species and at high doses of greater than 1E15 ions/sq-cm, the EOR range may extend from 1.5 Rp to 1.8 Rp or from 1.5 Rp to 2.0 Rp. The EOR region typically begins at the 1.0*Rp and extends down to a depth where most of the EOR defects are located (e.g., down to a depth of between 1.5 Rp to 2.0 Rp).

End of range region (EOR region) is the region in or under an implanted region that preferably contains 90% or more of the EOR defects.

In the figures, the EOR defects are drawn only outside the doped regions (e.g., source drain and halo regions) because the EOR defects when present outside and/or below these doped region causes severe leakage. If the EOR defects are in the doped region the leakage is considerable less.

End of range defects—are typically created by an implant that amorphrized the crystal (e.g., Si) structure. The EOR is typically below the crystal/amorphous interface in an implanted region.

Junction depth or depth of doped region—defined as depth from substrate surface where the n and p concentration are about equal. Schematically, the drawn junctions represent the boundary at which the n-type and p-type dopant are equal. These can be adjusted with adjusting the implant profiles either with different implant energy, dose and species type. In general, in the figures, the junction depth of the doped regions corresponds to a dopant concentration about 1E17 atom/cc.

SDE—source drain extension

PAI region—pre-amorphization implant region

III. OVERVIEW—GENERAL EXAMPLE EMBODIMENT

Some example embodiments form a carbon-containing layer in the EOR regions of an implanted (e.g.,) doped region in a silicon containing substrate. The carbon-containing layer and the implanted region can be formed in any order. The carbon-containing layer helps reduce defects from the implant that formed the implanted or doped region.

Figures 1, 1A:
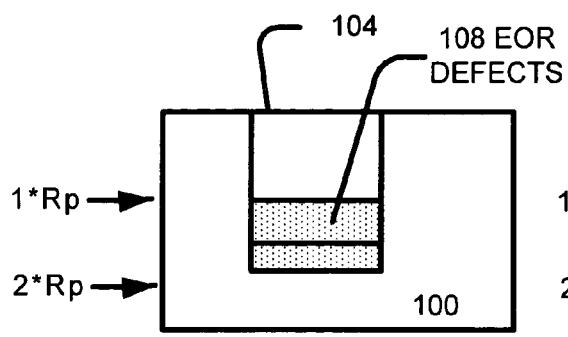
FIGS. 1A-1 and 1A-2, 1B, 1C1D show a method and structure according to first example embodiment of the invention.
Figures 1, 1A, 2:
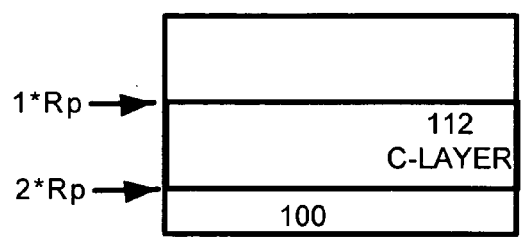

FIGS. 1A-1 and 1A-2 show the formation of the doped (can be active or non-active ion) or implanted region 104 and the carbon-containing layer 112. These steps may be formed in any order.

Referring to FIG. 1A-1, a region 104 is formed by an implant process. FIG. 1A-1 shows the depth of the projected range (Rp) or (1*Rp) of the implant and 2 times the depth of the projected range (2*Rp).

FIG. 1A-2 shows a carbon-containing layer 112 in a substrate. The carbon-containing layer 112 is preferably formed at in at least the EOR region of the implanted region. The EOR region is estimated to be at about at depth between 1*Rp and 2.0*Rp of the subsequently formed doped region.

Preferably the substrate is a crystalline Si substrate. Preferably the substrate is comprised of silicon. In an example embodiment the substrate is comprised of a lower strained region and an upper silicon cap; the lower strain region is comprised of $Si_{1-y}Ge_y$ or $Si_{1-y}C_y$ where y is between 0.01 and 0.3. The substrate can be any substrate structure used in semiconductor manufacture, such as, but not limited to SOI substrates.

Preferably the C-containing layer has a concentration between 5E18 and 1E20 Atoms/cc.

Preferably the carbon containing layer is comprised of $Si_{1-y}C_y$ alloy with y between about 0.001 and 0.005.

Preferably the C-containing layer is positioned at least in the EOR region of the doped region or regions(s). The doped regions can include the PAI, SDE, pocket, and/or S/D regions in any combination.

Preferably, the C-containing layer is positioned between the projected range of the doped region ($Rp^{dr}$) and 2.0 times the projected range of the doped region ($2*Rp^{dr}$). More preferably, the C-containing layer is positioned between the projected range of the doped region ($Rp^{dr}$) and 1.5 times the projected range of the doped region ($1.5*Rp^{dr}$).

Figure 1B:
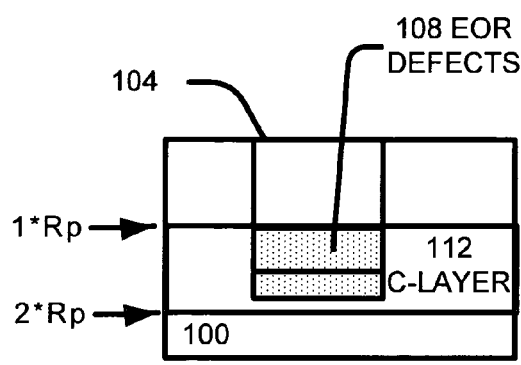

Referring to FIG. 1B, the doped region 104, the end-of-range (EOR) defects 108, and the carbon-containing layer are shown.

Figure 1C:
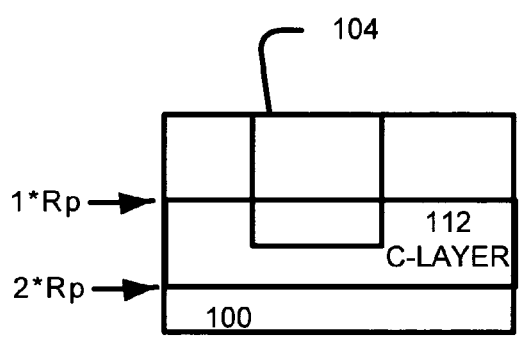

Referring to FIG. 1C, the substrate is annealed and the end-of-range (EOR) defects 108 are reduce because of the carbon-containing layer.

The doped region and the carbon-containing layer are preferably annealed at a temperature between 625 and 900° C. and more preferably between 650 and 850° C.; and most preferably between 650 and 800° C. The anneal is preferably performed for a time between 1 and 60 seconds and more preferably between 10 and 30 seconds. The carbon containing layer 112 ($Si_{1-y}C_y$) getters defects and allows the lower anneal temperature. The C-layer will diffuse during the anneal and may diffuse up above 1.0 Rp and down below 1.5 Rp to about 2.0 Rp.

Preferably, the carbon-containing layer is not positioned in a channel region of an FET.

A. C-containing Layer Between two Implanted Regions

Figure 1D:
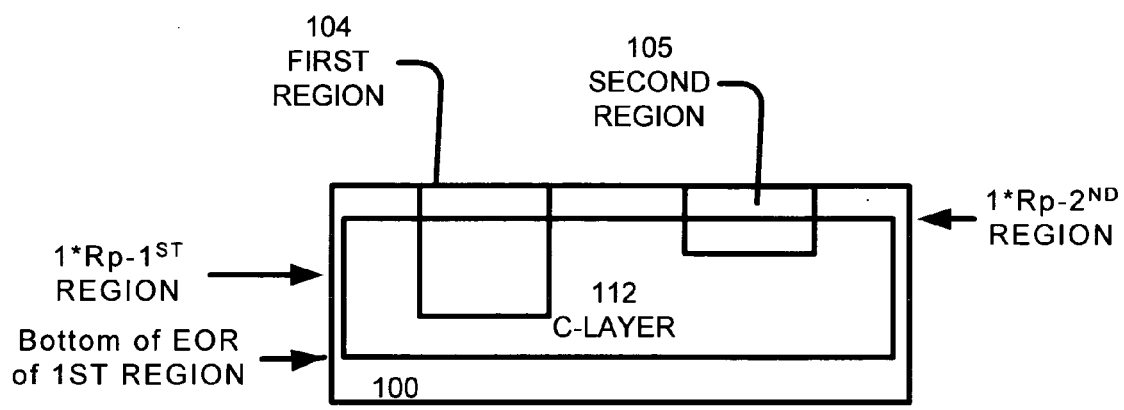

The C-containing layer can extend over and between the EOR regions two or more implanted regions. For example, referring to FIG. 1D, a first region 104 and a second region 105 are implanted in a substrate 100. A carbon-containing layer 112 is formed that extends from the top of the shallower EOR region (e.g., second region 105-the Rp of second region) to about the bottom of the lower EOR region (e.g., first region 104-1.5*Rp-$1^{st}$ region). The implanted regions and carbon-containing layer can be formed in any order. FIG. 1D is shown post anneal.

As a further example, the first region could be a source/drain region and the second region could be a pre-amorphization region (PAI region), pocket or SDE region. The regions are shown is a simplified layout only for illustration and can be configured/positioned differently in a device.

The following are non-limiting examples of the location of carbon-containing layer in different aspects of the embodiment:

☐ aspect—carbon-containing layer only extends from Rp-PAI to 1.5Rp SD

☐ aspect—c-layer extends only between Rp-SDE and 1.5*Rp SD
☐ aspect—c-layer only extends between Rp-pocket and 1.5*Rp SD
☐ aspect—c-layer only extends between Rp-SD and 1.5*Rp SD
☐ aspect—c-layer only extends between Rp-SD and 1.5*Rp SD
☐ aspect—carbon-containing layer only extends between 1Rp-PAI to 1.5*Rp-PAI
☐ aspect—carbon-containing layer only extends between 1Rp-SDE to 1.5*Rp-SDE
☐ aspect—carbon-containing layer only extends between 1Rp-pocket to 1.5*Rp-pocket
☐ aspect—carbon-containing layer only extends between 1Rp-SD to 1.5*Rp-SD

IV. EMBODIMENT—FIRST ASPECT—FET WITH C-CONTAINING LAYER—E.G., FIGS. 2A–2H

A main feature of the aspect shown in FIG. 2H is that preferably a carbon containing layer 20 ($Si_{1-y}C_y$) extends at least from the projected range of the SDE (Rp-SDE or $Rp^{SDE}$) through to the bottom of the source/drain end-of-range (EOR) region (e.g., 1.5 to 2.0 times $Rp^{SD}$).

The dopant end of range (EOR) region is typically found at a depth at least between about 1 to 1.5 times the Rp implanted species and more preferably between found at a depth between about 1 to 1.8 times the Rp implanted species and could be found at a depth between about 1 to 2.0 times the Rp implanted species.

In a first aspect of the embodiment, the carbon containing layer 20 can be formed by an implant process. (See e.g., FIGS. 2A to 2D).

In a second aspect of the embodiment, the carbon containing layer 20 can be formed by an growth or deposition process. (See e.g., FIGS. 4A to 4B)

The carbon containing layer 20 ($Si_{1-y}C_y$) getters defects from the SDE, pocket and S/D implants. The carbon containing layer 20 ($Si_{1-y}C_y$) is preferably not in the channel region.

The post S/D formation anneal, is preferably performed at a low temperature below 800° C. and preferably between 650 and 850° C. for between 5 seconds and 10 minutes. The carbon containing layer 20 ($Si_{1-y}C_y$) getters defects and allows the lower anneal temperature.

A. First Aspect of the Example Embodiment—carbon Containing Layer can be Formed by an Implant Process Forming A Carbon Containing Layer 20 In A Substrate Referring to FIG. 2A, a substrate 10 that has an upper crystalline silicon surface is shown.

The substrate may be a substrate employed within a microelectronics fabrication. Although not specifically illustrated within the schematic cross-sectional diagram of FIG. 1A, the substrate 10 may be the substrate itself employed within the microelectronics fabrication, or in the alternative, the substrate may be the substrate employed within tile microelectronics fabrication, where the substrate has formed thereupon or thereover any of several additional microelectronics layers as are conventionally employed within the microelectronics fabrication.

The substrate is preferably a silicon wafer. The substrate may further comprise wells.

Implantation to Form a C-containing Layer

As shown in FIG. 2B, a carbon containing layer 20 is formed by implanting carbon ions into the substrate.

Preferably the carbon layer 20 overlaps with the EOR of the a subsequent (dopant) implanted region. The carbon dose is preferably between 7.5E18 atoms/sq-cm and 1E20 atoms/sq-cm. The carbon implant can be either an amorphous or non-amorphous implant, and is preferably a non-amorphous implant.

As shown in FIG. 2C, the preferably the carbon implant projected range (Rp) overlaps the entire EOR of the dopant region(s) that we are using the c-layer to getter defects. Preferably the carbon layer Rp ($Rp^C$) is extents to depths between about 1 Rp-dopant to 2 times Rp-dopant (2*$Rp^{Dopant}$) and about preferably extends between 1.0 and 1.8 Rp-dopant and most preferably between 1.0 and 1.5 Rp-dopant.

As shown in FIG. 2C-1, the carbon layer preferably has a thickness (where the C concentration is greater than about 5E18 atom/cc) relative to the dopant region of between about 1.0 $Rp^{dopant}$ to 2.0 $Rp^{dopant}$. The Rp-carbon can preferably be between 0.9 and 1.6 Rp-dopant and more preferably of about between 1.0 and 1.5 Rp-dopant.

For example, the dopant can be the, PAI region (e.g., C or Si implant ions), SDE (source-drain extensions), the pocket region, and/or the source/drain regions.

The substrate and C-containing layer is preferably annealed after the dopant implant, such as after the source/drain implant.

The carbon containing layer 20 can be comprised of $Si_yC_{1-y}$. The carbon containing layer 20 is preferably comprised of $Si_yC_{1-y}$ alloy and preferably has a concentration with y between about 0.001 and 0.005.

The carbon containing layer 20 is preferably comprised of $Si_yC_{1-y}$ alloy and preferably has a C concentration of between 5E18 and 1E20 atoms/cc and more preferably of between 1E19 and 2E19 atoms/cc.

Figure 2A:
Figure 2E:
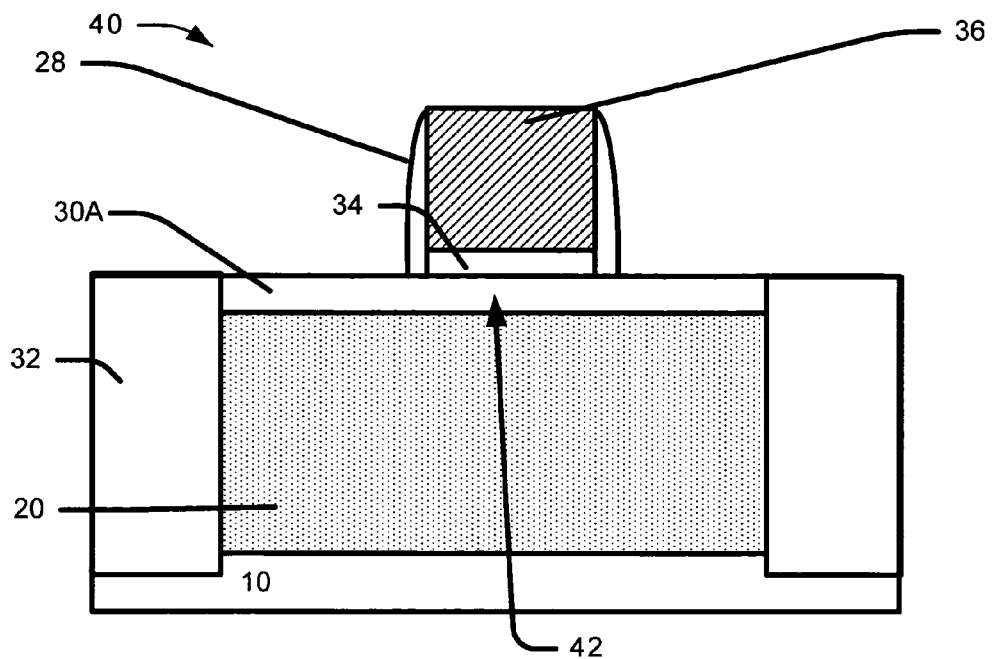

FIG. 2E shows the carbon-containing layer 20 at a depth below the substrate 10 surface with a region 30A of silicon-containing region above the carbon-containing layer 20.

Form A Gate Structure

Referring to FIG. 2E, we form a gate structure 40 over the substrate 10. A channel region 42 is in the substrate 10 under the gate structure.

The gate structure is preferably comprised of a gate dielectric 34, a gate electrode 36 and first gate spacers 38.

Implanting Ions to Form A Pocket Region

Figure 2F:
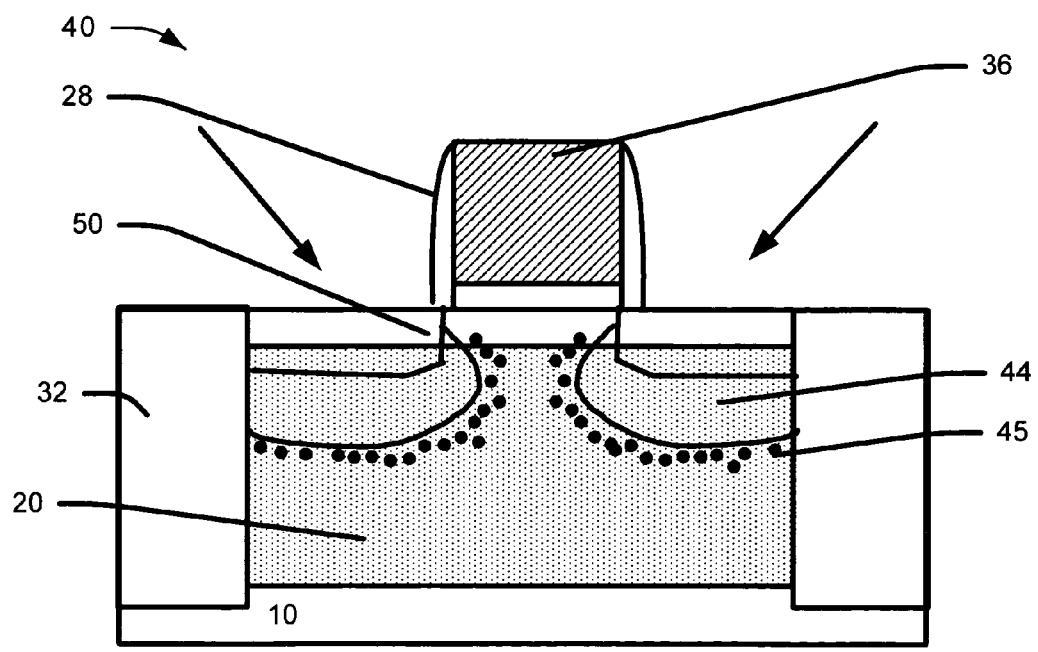

Referring to FIG. 2F, we implant ions to form a pocket region 44, a pocket EOR region and pocket EOR interstitials 45 in the pocket EOR region.

The pocket regions 44 is at least partially in the carbon containing layer 20. The pocket region 44 has the opposite impurity type as the SDE and S/D regions. The pocket regions 44 preferably has about the same concentration as the substrate or well and channel region.

The depth for the pocket region 44 and the pocket EOR region depends on the technology node of the device being formed.

Form S/D Extension Regions

As shown in FIG. 2F, we form source drain extension regions (S/D extension regions 50, SDE) in the substrate adjacent the gate structure.

The SDE regions preferably have a depth between 10 and 50 nm and a concentration between 1E19 and 1E21 atom/cc.

The SDE implant also forms EOR defects (not shown) in a SDE EOR region.

Forming S/D Spacers

Figure 2G:
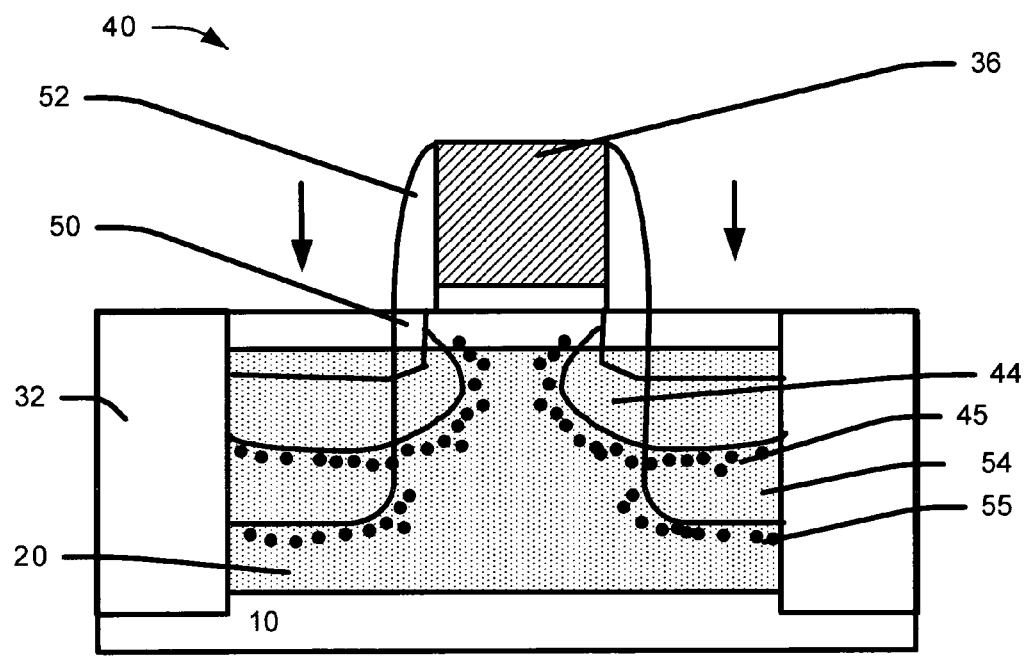

As shown in FIG. 2G, we form S/D spacers 52 on the sidewalls of the gate structure 40. The S/D spacers 52 can be formed over existing spacers 28.

Forming Source/Drain Regions

As shown in FIG. 2G, we form source/drain regions 54 in the substrate adjacent the gate structure. Schematically, the drawn junctions represent the boundary at which the n-type and p-type dopant are equal. These can be adjusted with adjusting the implant profiles either with different implant energy, dose and species type.

The source/drain regions 54 formed by an ion implant process where preferably the S/D EOR region are in the C-containing layer 20.

The region between about Rp and 1.5 Rp is an estimate of the region of the EOR defects location. For larger implant species and at high doses of >1E15 the EOR may extend from 1.5 Rp to 1.8 Rp. In the figures, the EOR defects are drawn only outside the source drain and halo region because the defects when present in these region causes much severe leakage compared to if the defect is present in the source-drain region itself.

Position Of The C-containing Layer

Preferably the dopant regions and carbon-containing layer are positioned so that the carbon containing layer extends between the $Rp^{SDE}$ to the bottom of the S/D EOR region (e.g., $2.0*Rp^{SD}$). Substantially all of the channel region is preferably not the carbon containing layer.

The depths of the source/drain regions 54, source/drain projected range source/drain EOR regions depend on the technology.

The projected range and end-or-range regions for the SDE regions, pocket implant region, and the source/drain implant regions are preferably in the carbon containing layer.

In other aspects of the embodiment, any combination of the projected range and end-or-range regions for the (a) PAI regions (b) SDE regions, (c) pocket implant region, and (d) the source/drain implant regions are in the carbon containing layer.

Annealing the Substrate

Still referring to FIG. 2H, we preferably anneal the substrate (in a post S/D anneal) whereby the carbon containing layer acts as a sink for defects (e.g., interstitials) from the pocket implant, and source/drain implant.

The c-layer anneal performed at a temperature between 650 and 850 degree C. and for a time between 1 and 60 seconds and more preferably between 10 and 30 seconds. Preferably this C-containing layer anneal is the higher temperature anneal the device is subjected to.

Depending on the technology, there may be anneals before the post S/D anneal, such as post SDE.

The carbon containing layer 20 ($Si_{1-y}C_y$) getters defects from the SDE, pocket and S/D implants. The carbon containing layer 20 ($Si_{1-y}C_y$) is preferably not in the channel region. The channel region depth is a function of the device and technology and varies with the electric field. Currently, the channel region has a depth of from about 3 Å to about 10 Å.

B. Example Positions of the Carbon Containing Layer

FIG. 3A shows an aspect where the SDE EOR region is in the c-layer.

FIG. 3B shows an aspect where the pocket EOR region is in the c-layer.

FIG. 3C shows an aspect where the SD EOR region is in the C-containing layer.

Other combinations of aspects are possible.

V. SECOND ASPECT OF EXAMPLE EMBODIMENT—C-CONTAINING LAYER FORMED BY A GROWTH PROCESS

In a second aspect for forming the carbon-containing layer, a growth process is used to form the carbon-containing layer.

Figure 4A:
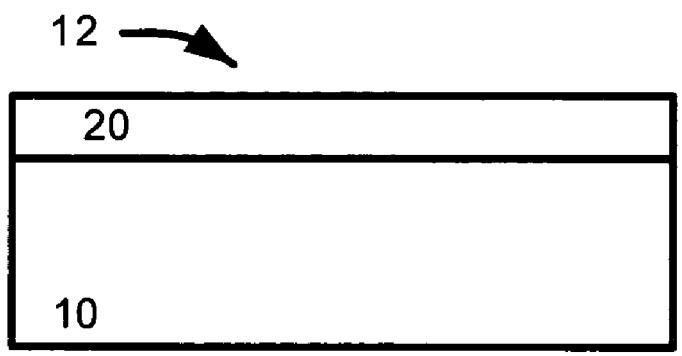
FIGS. 4A and 4B show a second aspect of an embodiment, where the carbon containing layer 20 can be formed by an growth or deposition process.

Referring to FIG. 4A, we form a carbon containing layer 20 over or on a substrate 10.

The carbon containing layer 20 can be formed by a growth method such as chemical vapor deposition or epitaxy growth. Most preferably the carbon containing layer 20 comprised of $Si_yC_{1-y}$ is formed by a epitaxial growth process. The carbon containing layer 20 preferably has parameters (e.g., thickness, concentration) as described above.

Figure 4B:
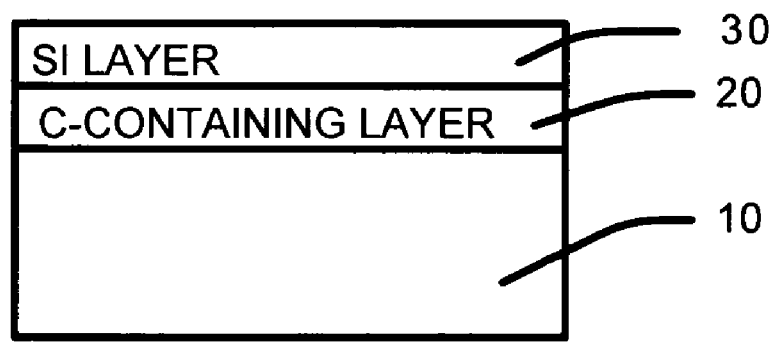

Referring to FIG. 4B, we form a silicon layer 30 (or silicon containing layer) over or on the carbon containing layer 20.

The silicon layer 30 is preferably comprised of a silicon epitaxy layer formed by an epitaxy process. The silicon layer is preferably a crystalline Si.

For a given technology, the silicon layer 30 (e.g., silicon cap layer) preferably has a thickness between 200 and 500 Å.

The silicon layer 30 preferably has a thickness about $0.5*$thickness of the gate oxide$+(1-1.5*Rp^{SDE})$. For example if $t_{ox}$ (Thickness of gate oxide)=20 Å, $RP^{SDE}$=20 nm then $T^{Sicap}$=31 nm.

The process continues as explained above in the first aspect and shown in FIGS. 2E thru 2G.

VI. EXAMPLE EMBODIMENT—SUBSTRATE STRUCTURE FURTHER COMPRISES A STRAINED REGION

In a example embodiment, shown in FIGS. 5A to 5H, the substrate structure includes a strained layer. The structure is preferably comprised of a lower strained region (110) and overlying upper (unstrained) silicon cap 116. The lower strain region 110 is preferably comprised of $Si_{1-y}Ge_y$ or $Si_{1-y}C_y$ where y is between 0.001 and 0.0003.

In a first aspect, the strained region is formed by growth or chemical vapor deposition process. (e.g., FIG. 5A to 5H)

In a second aspect, the strained region is formed by implant process.

The embodiment is discussed in more detail below.

A. First Aspect—Grown Strained Layer

In the first aspect of the embodiment, as shown FIGS. 5A to 5D, 5E to 5H, substrate structure is comprised of a substrate 10, a lower strained region 110 and a upper silicon cap 116.

Figure 5A:
FIGS. 5A, 5B, 5C, 5D, 5E, 5F, 5G and 5H show a method and structure for an example embodiment where the substrate structure comprises a strained layer.

Referring to FIG. 5A, a substrate 10 is shown.

Figure 5B:
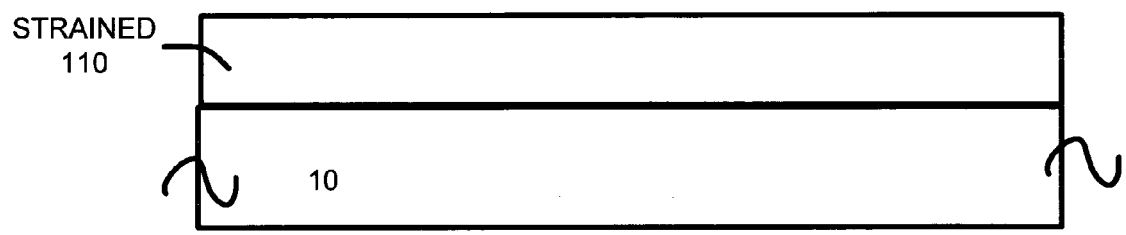

Referring to FIG. 5B, a strained region 110 is formed over the substrate 10. The strained inducing material is preferably grown on the substrate to a thickness sufficient to induce strain in silicon i.e., $Si_{1-x}Ge_x$ or $Si_{1-x}C_x$ where x is between about 1 and 30% and more preferably x is between about 1 and 10%.

Figure 5C:
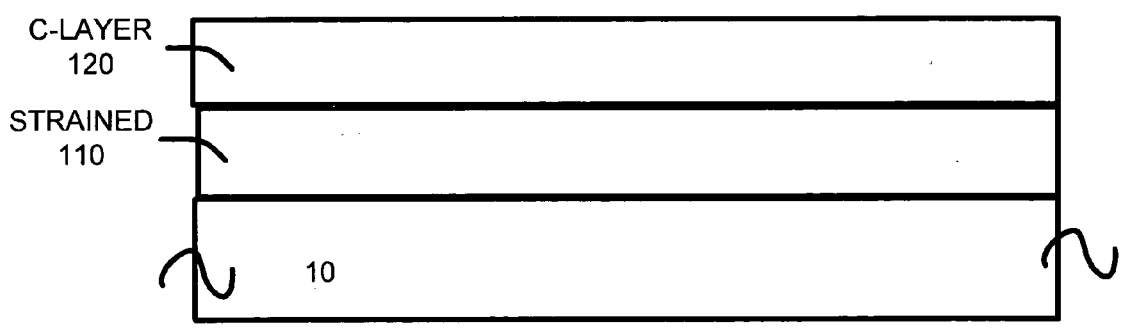

Referring to FIG. 5C, a carbon containing layer 120 is formed over the strained region 110. The carbon containing layer is preferably deposited or grown along with the strained region whose intended position is dependent on the implantations of the S/D SDE.

Figure 5D:
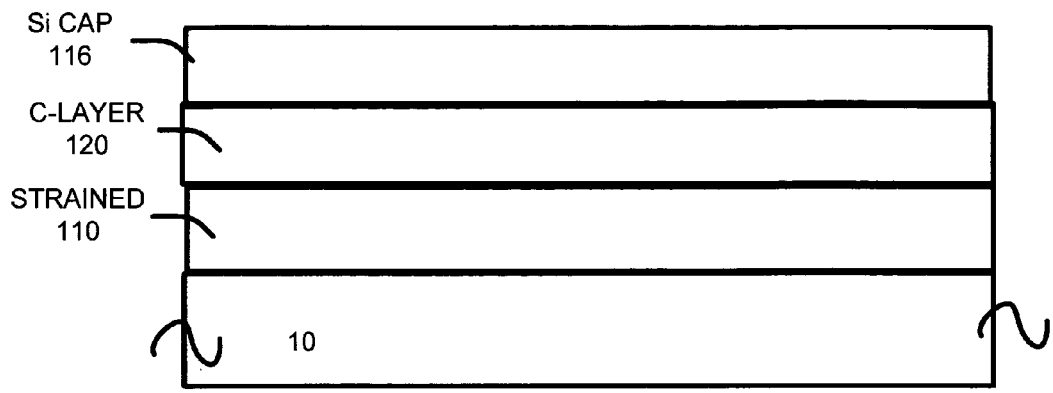

Referring to FIG. 5D, an optional silicon layer 116 is formed over the carbon containing layer 120. The silicon layer is preferably comprised of silicon, but can have other elements. The carbon containing layer is comprised of a upper silicon layer 116 and a lower carbon containing layer 120.

Preferably in this technology, the silicon (containing) layer 116 has a thickness between 0 and 100 Å and more preferably between 5 and 100 Å. The silicon layer is preferably not strained. The desired channel location and stress/strain can determine thickness of the silicon layer. For example, for a compressive strain channel, for a $Si_{1-y}Ge_y$ strained region 110, a Si-layer is not formed. For example, for a compressive strain channel, for a $Si_{1-y}C_y$ strained region 110, a Si-layer preferably has a thickness between 60 and 100 Å.

For example, for a tensile strain channel, for a $Si_{1-y}Ge_y$ strained region 110, a Si-layer preferably has a thickness between 60 and 100 Å. For example, for a tensile strain channel, for a $Si_{1-y}C_y$ strained region 110, a Si-layer is not formed.

B. Second Aspect—Strained Region is Formed by Implant Process.

In a second aspect, the strained region is formed by an implant process. For example, Ge or C ions can be implanted into the substrate. The process continues as discussed below. For example, referring to FIG. 5D, a strained layer 110 formed by an implanted. Also referring to FIG. 5D, the C-containing layer 120 can also be a strained layer.

C. Steps to From Device—FIGS. 5E to 5H

Figure 5E:
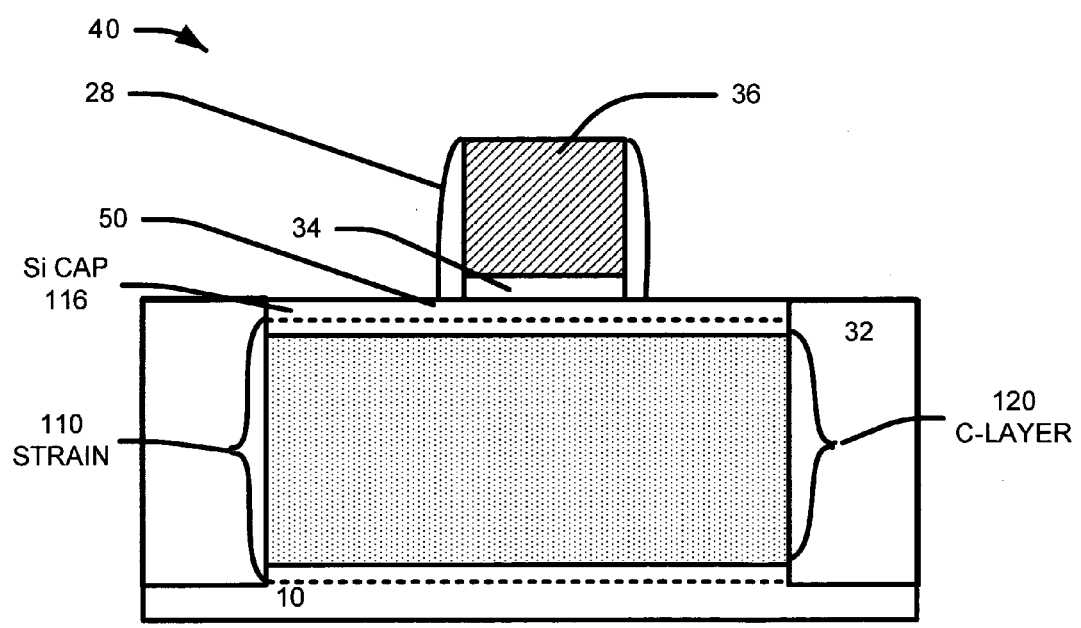

Referring to FIG. 5E, processes are performed to form a structure preferably has a carbon containing region 120 (carbon rich region) and strain region 110, a silicon cap 116, a gate dielectric 34, a gate electrode 36 and gate spacers 38.

The carbon containing region 120 and the strained region 110 are preferably formed using an epitaxy process and more preferably a RPCVD process.

The strained region 110 is preferably comprised of $Si_{1-x}Ge_x$ or $Si_{1-x}C_x$ where x is between about 1 and 30% and more preferably x is between about 1 and 10% and preferably has thickness of about 1 µm (0.8 to 1.2 µm) to induce strain in the channel.

Figure 5F:
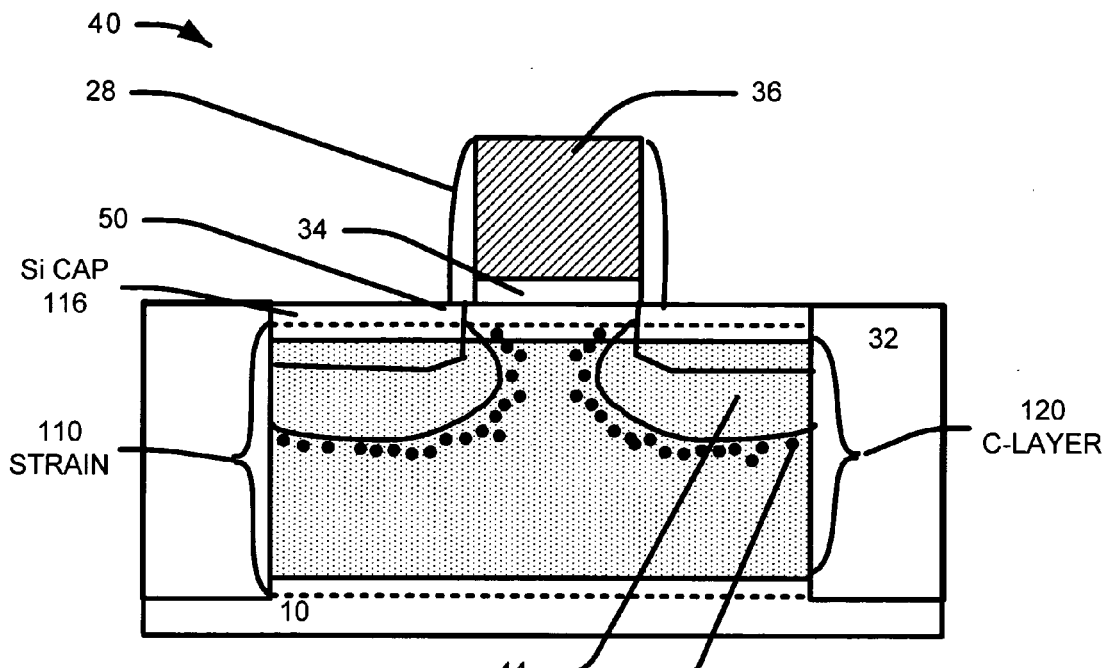

Referring to FIG. 5F, a pocket implant is performed to form a pocket region 44. A pocket end-of-range (EOR) region and pocket interstitials 45 are undesirably formed.

Figure 5G:
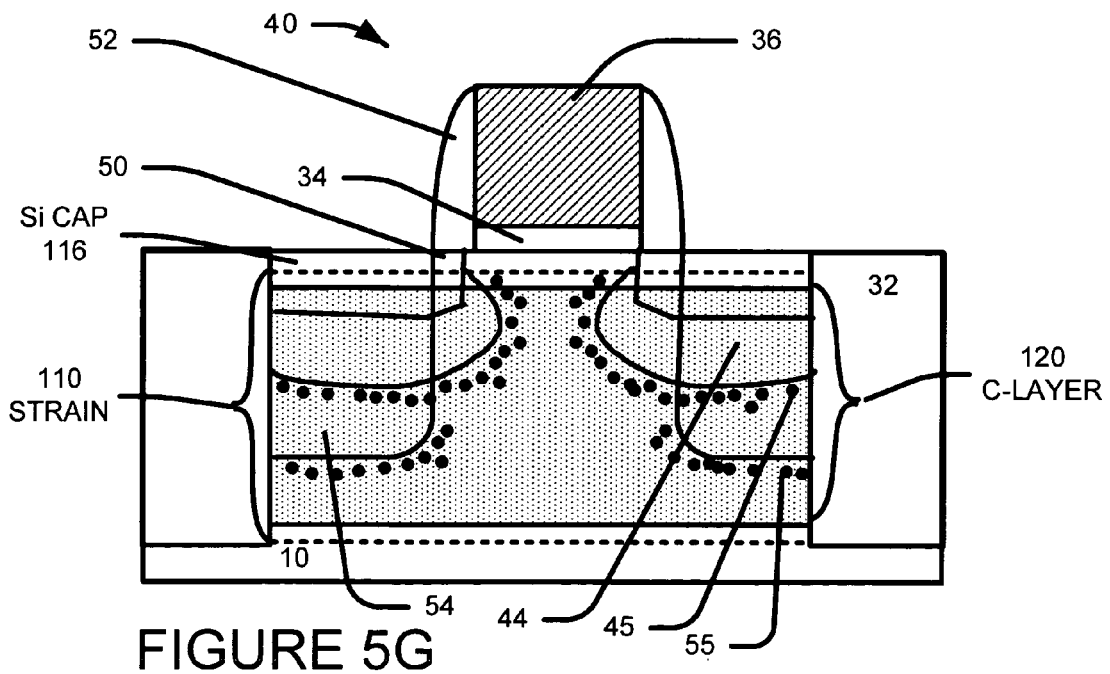

Referring to FIG. 5G, spacers 52 are formed over the gate structure sidewalls. The spacers 52 can be formed over the (first) spaces 38.

Next, source/drains 54 are formed by a S/D implant. S/D interstitials 55 are undesirably formed in a S/D end-of-range (EOR) region.

Figure 5H:
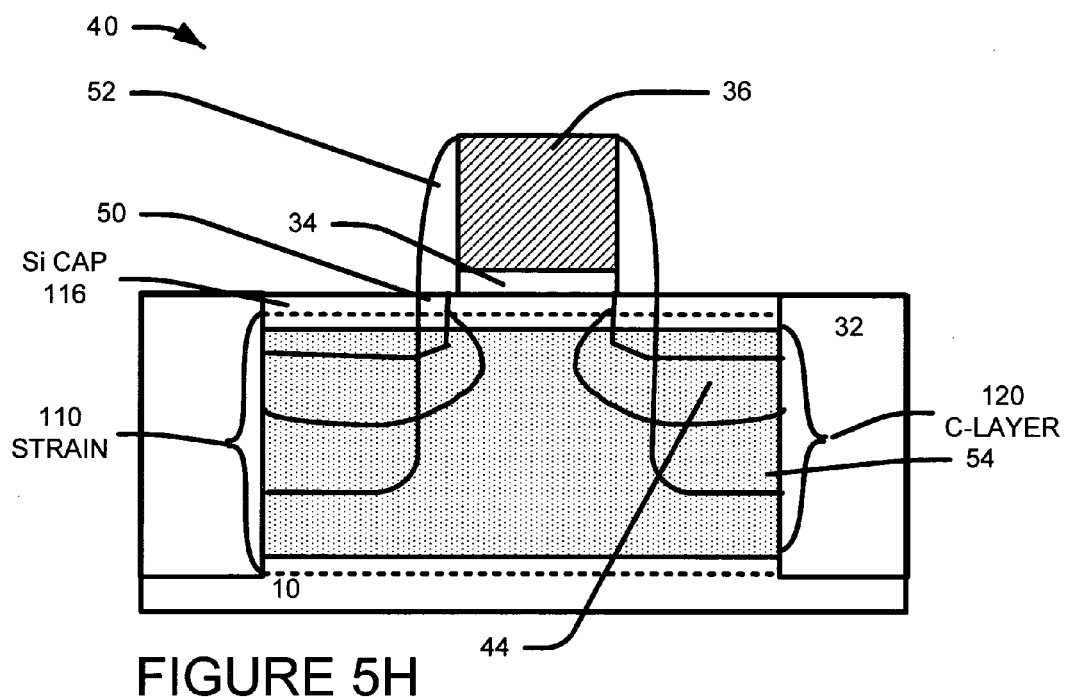

Referring to FIG. 5H, the structure is annealed where preferably the interstitials are removed.

The carbon rich layer 120 preferably extents between (a) 1 to 1.5 $Rp^{SDE}$ and 1.0 to 2.0 $Rp^{SD}$.

VII. EMBODIMENT—"RETROGRADED C-CONTAINING LAYER"

In another example embodiment, a "thin" C-containing layer is formed in a substrate. When the thin C-containing layer is anneal, the carbon-containing layer diffuses up towards the surface and down towards the substrate center to create a "retrograded C-containing layer". This reduces the C in or near the channel region of the FET.

Figure 6A:
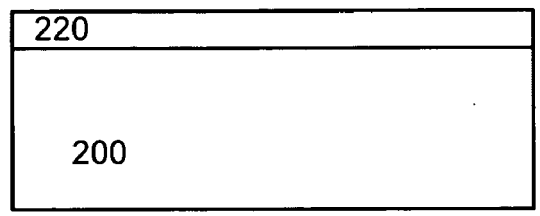
FIGS. 6A, 6B, 6C and 6D show a method and structure for an example embodiment wherein the carbon-containing layer diffuses up towards the surface and down towards the substrate center to create a "retrograded C-containing layer"

Referring to FIG. 6A, the thin C-containing layer 220 is formed in or on a substrate 220. The C-containing layer 220 is preferably formed by an epitaxy process.

Figure 6B:
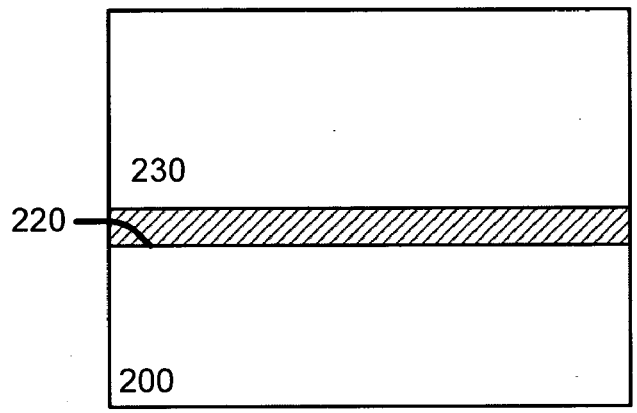

As shown in FIG. 6B, a silicon layer 230 is formed on or over the thin C-containing layer 220. The "thin" C-containing layer 220 (no anneal) preferably has a thickness between ~30 and 60 nm. The carbon-containing layer (before anneal) preferably has a concentration between 1E19 and 1E20 atom/cc.

Figure 6C:
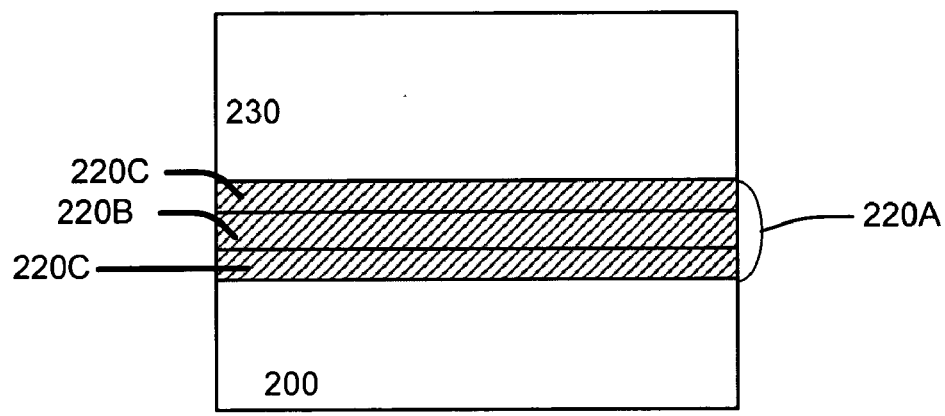

As shown in FIG. 6C, we anneal the thin C-containing layer 220 to form a retrograde C-containing layer 220A. The retrograde retrograde C-containing layer 220A has outdiffusions 220C and center part 220B. The thin C-containing layer preferably is formed in the substrate in the subsequently formed EOR region of the source/drain region.

The carbon-containing layer (after anneal) preferably has a concentration between 1E18 and 1E20 atom/cc. The carbon-containing layer concentration is reduced after anneal because the C diffuses during the anneal. The carbon-containing layer 220A (after anneal) preferably extends at least between $RP^{SDE}$ and $1.8*Rp^{S/D}$.

Figure 6D:
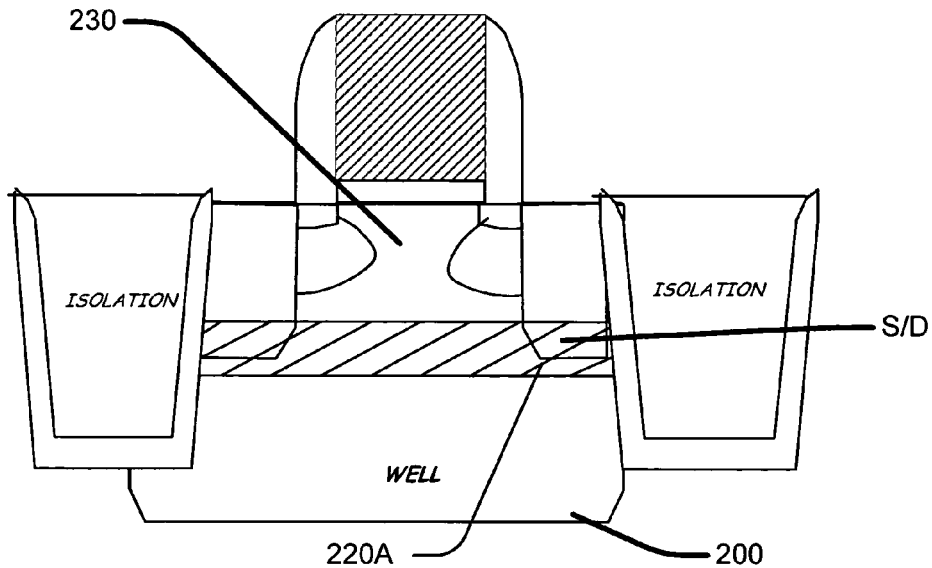

FIG. 6D shows a FET device formed on a substrate. Referring to FIG. 6E, the following are formed: gate structure, SDE, pocket region, S/D regions. The retrograde C-containing layer 220A is shown after the anneal. The retrograde C-containing layer 220A preferably extends from the Rp of the S/D region to 1.5 Rp of the S/D region.

The C concentration on the top and bottom regions is preferably between 1E18 and 1E19 and the C concentration in the center of the region 1E19 to 1E20 atoms/cc.

Preferably the retrograde C-containing layer 220A is deep in the substrate away from the channel region and preferably in the EOR region of the source/drain region.

The carbon in the carbon containing layer diffuses up into the Si layer 30 and down into the substrate during subsequent heat processes thereby the carbon contain layer has a retro grade profile. During subsequent thermal processing steps, the carbon layer diffuses both way, both upward towards the surface of the silicon and deeper into the silicon substrate. The upward diffusion of the carbon impurity would cause graded profile where high concentration is obtained at the region where carbon is grown and its concentration decreases towards the silicon surface, decreasing the occurrence of accumulation of carbon species at the channel region.

In another embodiment, preferably the retrograde carbon containing region extends between the Rp-SDE and the bottom of the S/D EOR region (e.g., 1.5 to 2.0*Rp-SD).

VIII. EMBODIMENT —METHOD FOR FORMING AN IMPLANTED C-REGIONS IN EOR REGIONS

A. Overview

Figure 7A:
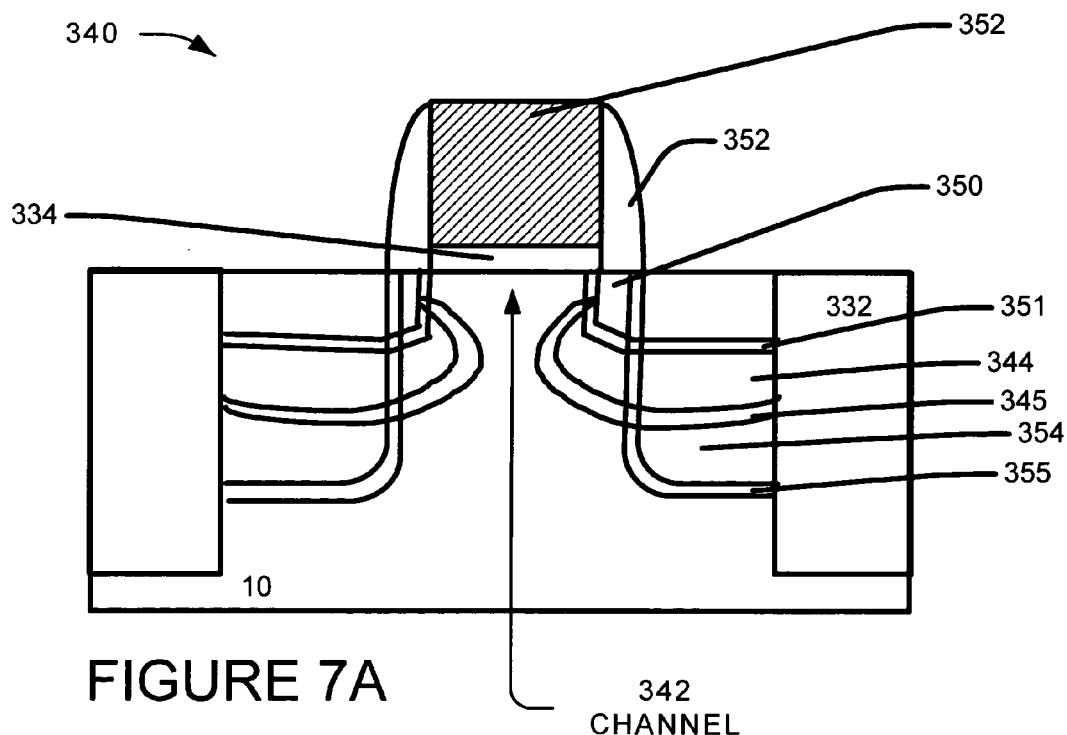
FIG. 7A shows an example embodiment for a structure and method for forming implanted C-containing regions in a semiconductor device in the projected range and EOR ranges of implanted (doped or PAI) regions such as SDE, S/D, pocket implant regions.

Referring to FIG. 7A, in an example embodiment, a structure and method are described for forming implanted C-containing regions in a semiconductor device in the projected range and EOR ranges of implanted (doped or PAI) regions such as SDE, S/D, pocket implant regions.

As shown in FIGS. 7B-1, 7B-2 and 7B-3, in general, an aspect is that we form an implanted C-containing region and a EOR region within the doped region.

Figures 1, 7B:
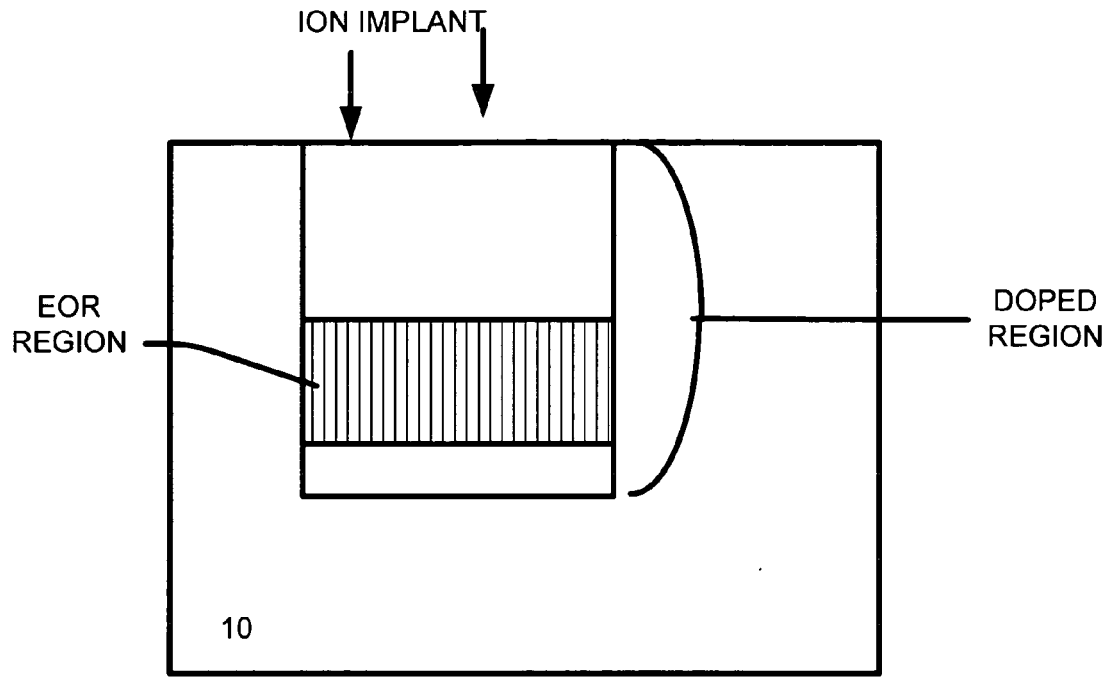
Figures 2, 7B:
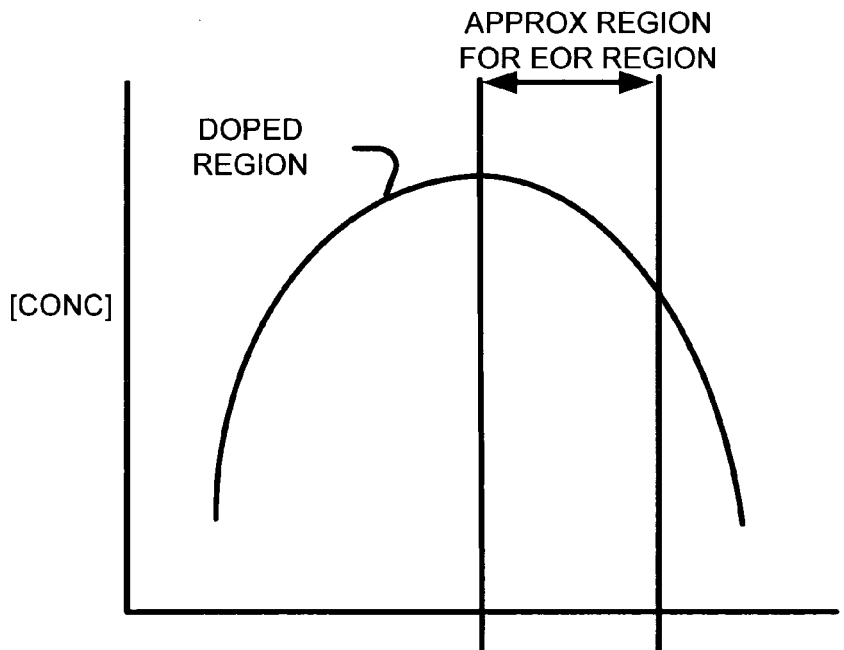

FIG. 7B-1 shows an implanted doped region and an EOR region.

FIG. 7B-2 shows a rough concentration profile on an implanted region. The EOR region usually is present at a depth between 1 Rp and 1.8 Rp or more usually between about 1 Rp and 1.5 Rp.

Figures 3, 7B:
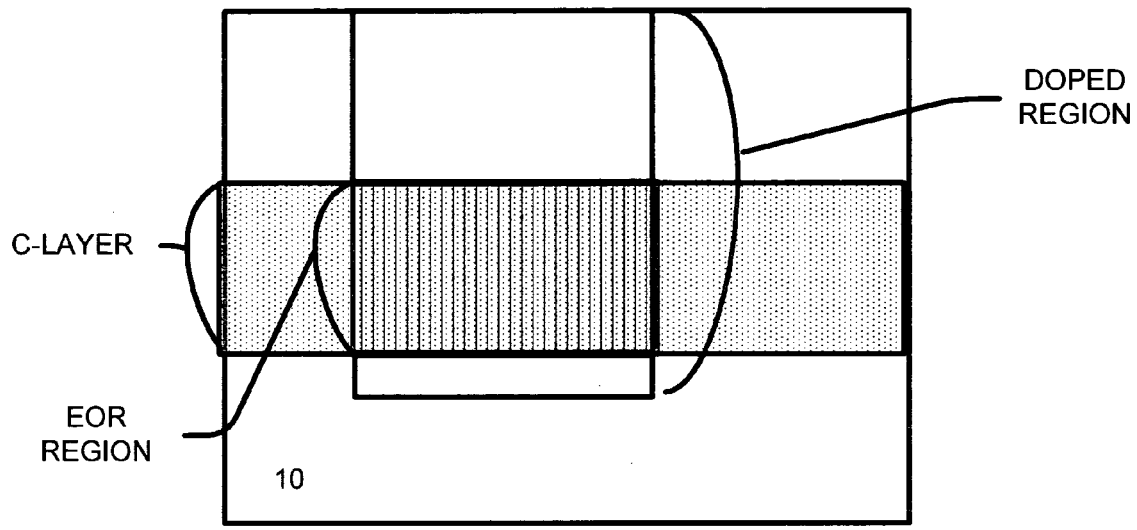
Figures 4, 7B:
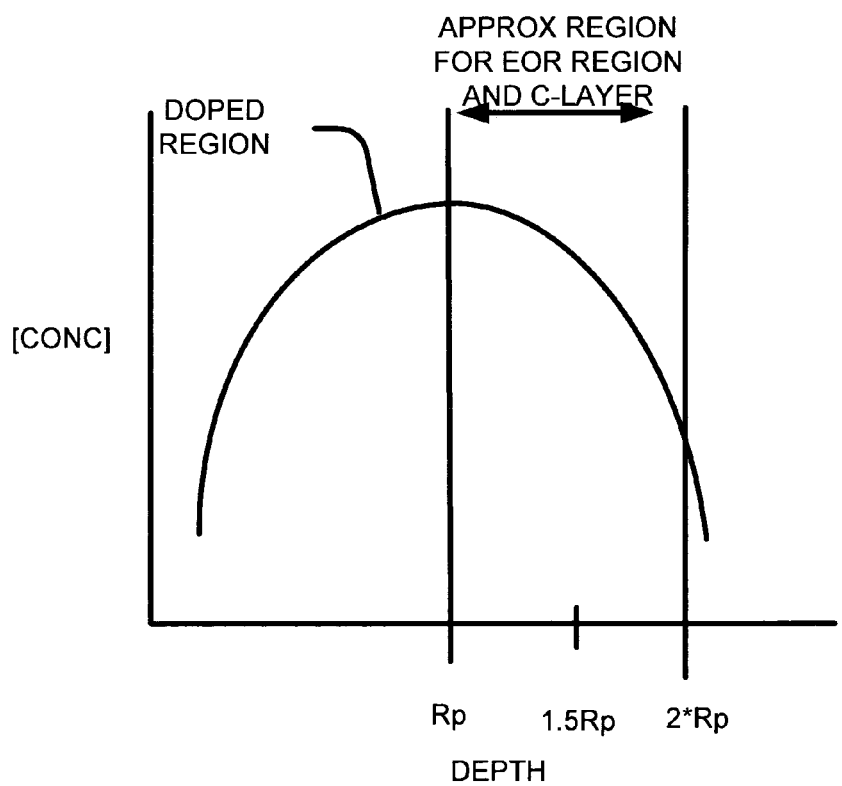

As shown in FIG. 7B-3, we form a C-containing layer about in the projected region and the EOR region. The C-containing layer is preferably formed by an implant process. The C-containing layer getters defects from the doped region and EOR region. The carbon-containing layer extends from between a depth 1.0 $Rp^{dopant}$ and 2.0*Rp dopant. The carbon-containing layer preferably has a concentration above 5E18 atoms/cc from between a depth at the $Rp^{dopant}$ and 2.0 $Rp^{dopant}$.

The carbon-containing layer more preferably has a concentration between 5E18 and 1E20 atoms/cc from between a depth at the $RP^{dopant}$ and 2.0 Rp dopant. The carbon-containing layer preferably as a $Rp^{C\ containing-layer}$ located between $Rp^{dopant}$ and 1.5 $Rp^{dopant}$.

For the embodiment, the parameters for the C-implant and C-containing layers are as described above unless otherwise noted.

B. Form a Gate Structure

Referring to FIG. 7A, we provide a substrate 300. The substrate is preferably a pure semiconductor material(s) such as a Si wafer or a Si/Si strained Si structure.

We form a gate structure 340 over the substrate. A channel region 342 is in the substrate under the gate structure.

C. Form a Pocket Region and a Pocket EOR Region

We implant ions to form a pocket region 344, pocket projected range region and a pocket EOR region (not shown but roughly located in the carbon-containing pocket EOR layer 345) in the substrate.

The pocket implant process can comprise As, B, $BF_2$+. P or P ions at a dose between 1E13 and 1E14 ions/sq-cm, at an energy sufficient to located the pocket implant region below the SDE but shallower than the S/D region.

D. Form a Carbon-containing Pocket EOR Region

We implant C ions preferably at least into the pocket EOR regions to form a carbon-containing pocket EOR region 345. The Rp of the C-containing pocket region is preferably between $1*Rp^{pocket}$ and $2*RP^{pocket}$ and more preferably between $1*Rp^{pocket}$ and 1.5 $RP^{pocket}$.

The carbon-containing pocket EOR region 345 preferably a carbon concentration between 5E18 and 1E20 atom/cc.

For example, for a B pocket implant of 1E15/sq-cm at 30 Kev, an example of the C-implant process parameters are: 7E13 ions/sq-cm at between 35–40 KeV at same twist and tilt angle as the pocket implant.

In general, the implants of the doped regions and carbon-containing regions can be performed in any order. For example, the C-containing regions 345 can be implanted before the pocket region 344.

E. Form SDE Regions and SDE EOR Regions

We form SDE regions 350 and SDE EOR regions preferably using an implant process in the substrate adjacent the gate structure. The implant process for the SDE's can form EOR regions where EOR defects are formed in the crystal lattice.

F. Implant C Ions into the Substrate in the SDE EOR Region to Form Carbon-containing SDE EOR Regions 351

Then we implanting C ions into the substrate in the SDE EOR region to form carbon-containing SDE EOR regions 351. The preferred parameters for the C-containing layer and the C-implant are described above.

For example, for an As SDE implant of: implant angle of 7 degrees, 22 degree twist, 2 keV, 1.5E15 dose and An example of the C-implant process parameters are: C does 7E13 atoms/sq-cm at 2 KeV with similar twist and tilt as SDE.

G. Form S/D Spacers

We form S/D spacers 352 on the sidewalls of the gate structure 340.

H. Form Source/drain Regions and Source/drain EOR Regions

We form source/drain regions 354 and source/drain EOR regions 355 adjacent the gate structure.

The source/drain regions 354 are preferably formed by an ion implant process. The channel region is preferably not in any carbon containing layer.

I. Form Carbon-containing Source/drain EOR Regions

We implant C ions into the substrate in the source/drain EOR regions to form carbon-containing source/drain EOR regions 355.

The carbon-containing source/drain EOR regions 355 preferably have a carbon concentration between 5E18 and 1E20 atom/cc, and a thickness related to the $Rp^{dopant}$ as described above.

An example of the C-implant process parameters are: 7 degree angle, 22 degree twist, 10–50 KeV energy, and 1E14 atoms/sq-cm dose.

J. Anneal

We preferably anneal the substrate whereby the carbon containing layers act as a sink for defects (interstitials) from the pocket implant, the SDE implant and source/drain implant.

Preferably the end-or-range regions for the pocket implant, the SDE implant and the source/drain implant are in the carbon containing layers.

The anneal is preferably performed at a temperature between 650 and 899 degree C. and for a time between 1 and 60 seconds and more preferably between 10 and 30 seconds. More preferably, the anneal is performed at a temperature between 650 and 850 degree C. and for a time between 1 and 60 seconds and more preferably between 10 and 30 seconds. This anneal has a lower temperature than a standard anneal. A standard anneal is performed at a T between 900 and 1100 degree C.

An example of the preferred order of implants is: carbon-containing pocket EOR region 345, pocket region 344, C-layer 351, SDE 350, C-layer 355, and S/D regions 354. However, the implants can be performed in other orders.

IX. EXAMPLE EMBODIMENT—C-CONTAINING LAYER IN EOR OF PAI IMPLANTS

In an example embodiment, a C-containing layer is formed in the EOR of a pre-amorphization implant (PAI). See, for example, FIGS. 8A thru 8C.

Amorphous layers created using non-dopant implants are used in conjunction with shallow implants to reduce channeling and to affect TED and dopant activation. To prevent the channeling of boron implant, a Ge implantation is introduced prior to Boron implantation followed by an annealing process which conditions are just sufficient for solid phase epitaxy regrowth (SPEG) of the silicon crystal, typically at 600–800 C for several seconds. The annealing condition is good as it provides high activation and minimized boron diffusion in the silicon substrate. However, the implantation of Ge by itself introduces massive EOR defects at the tail end of PAI implantation region which leads to leakage current in the MOSFET.

In this embodiment, a layer of carbon rich region is placed at the PAI implant profile region and subsequently annealed at SPEG conditions. It is possible to eliminate the EOR defects which are typically associated with the low temperate annealing of <900° C.

Boron which is a small dopant species experiences channeling phenomena when implanted into the silicon lattice. This would result in the boron dopant landing in a projected depth of up to 4 times its intended projected range, a phenomena which is undesirable for the compliance to the Ultra-shallow junction roadmap. Boron implant is often performed at doses of >1E15 and energy of <1 keV.

An approach to PAI is as follows. Prior to the B implant, a pre-amorphization implant (PAI) step is performed to induce amorphization to the crystalline substrate to induce disorder. The prevents the B channeling phenomenon. PAI implants are currently typically performed for p-type regions, but PAI implant could be used also.

One problem associated is the annealing at low temperatures for boron activation after the implantations in a CMOS fabrication process. The EOR defects resulted from the aggressive PAI implant (typically with Ge species of 5–10 keV at doses >1E15) results in high density of residual EOR defects after anneal. The presence of these defects results in high leakage current when present in the reverse biased PN junction.

A. Form C-containing Layer in PAI EOR Region

Referring to FIG. 8A, a gate structure 840 is formed on a substrate 800. A PAI implant is performed to form a PAI region 860 and PAI EOR defects 865.

Referring to FIG. 8B, a carbon-containing layer 820 is (e.g., implanted) formed with preferably with a concentration preferably less than 0.5% at a depth preferably between 1.5 and 2.0 Rp of the PAI implanted region. In a preferred embodiment the carbon-containing layer 820 extends between a depth of 1.5 and 2.0 Rp of the PAI implanted region.

Referring to FIG. 8C, a SDE implant is performed to form SDE regions 850. Preferably P-type (e.g., boron) dopants are implanted.

Referring to FIG. 8C, an SDE anneal is performed preferably at a temperature less than 950° C. The residual defects that are typically formed are eliminated due to the carbon-containing layer.

X. EXAMPLE BENEFITS RELATED TO SOME EXAMPLE EMBODIMENTS

A. High Temperature Anneals of Implant Damage have Undesirable Effects

An annealing process is typically performed after implantation at significantly high temperatures to remove the implantation induced damage from the silicon. Three considerations for annealing of the implantation damage are as follows.

1) Reconstruction of the Crystalline Lattice due to Amorphization

This process involves a solid phase epitaxy process (SPE), requiring the reconstruction of the silicon crystalline lattice and occurs at temperature ranging from 500 to 800° C. and above. The growth rate of the amorphous layer is strongly dependent on the temperature, with higher growth rate for higher annealing temperatures.

2) Removal of Defects

During SPE, clustering of silicon interstitials at the end-of-range (EOR) region causes the formation of secondary defects (eg. Dislocation planes and defect loops). These defects when present in the depletion region of the pn junction cause severe leakage current to the junction and must be removed. However, the removal of these defects require high activation energy (Ea ~5 eV) requiring HIGH TEMPERATURES (Typically >950° C.) processing conditions.

3) Activation of the Dopants

Implanted dopants into the silicon substrate occupy interstitial sites and must be activated before it can function as acceptors or donor ions in silicon. The activation of dopant ions involves placing or moving the dopants located at the interstitial sites back into the substitutional sites in silicon. Generally, the higher the annealing temperature, the higher the activation. However, a large percentage of the implanted dopant ions are activated during the SPE process, where the dopants are incorporated to the substitutional silicon sites along with the re-crystallization growth of the silicon lattice.

The problem with the annealing of ion implantation induced damage is that they require very extreme temperature processing conditions with typically Rapid Thermal Anneal (RTA) of >1000° C. for times of 30–60s for effective annealing, usually the highest temperature in the fabrication process. Such high temperature processing conditions causes dopant diffusion which is undesirable and difficult to control for the continuous scaling of the MOSFET into the nano-meter channel length regime. Also the loss in the desired strain in the strained silicon substrate.

B. Example Embodiments

By means of the introduction of a layer of carbon rich region, some of the embodiments of the invention can eliminate the problem associated with problem 2—Removal of Defects.

Carbon species when present in the silicon lattice can act as sink for interstitials. By incorporating carbon into silicon, the carbon can reduce the presence of EOR defects. Also, the activation energy for carbon to perform as silicon sinks is in the range of 2.5 to 3 eV. This is about similar activation energy for the regrowth of amorphization layers. Hence, there is an indication of possibility of the reduction in thermal budget. This would reduce the required annealing temperature condition, reducing the overall thermal budget of the MOSFET device fabrication process.

Carbon which performs as silicon interstitial sinks, prevents the enhanced dopant diffusion (e.g., Phosphorus, Boron and Indium), whose mode of enhanced diffusion is dependent on the concentration of silicon interstitials present in the region. The C-containing layer can have the following advantages:

1) Facilitation of Ultra-Shallow Junction formation
2) Better control of transistor short channel effect (SCE) and reverse short channel effect (RSCE) as lower temperature processing condition decreases dopant diffusion in the channel region of the MOSFET.
3) Retention of the desired strain in strained silicon technology.

XI. EXAMPLES

A. Experimental Results On Annealing of Samples Implanted With Heavy Indium Dose ($1 \times 10^{14}$ cm$^{-2}$) →As Source Drain Implantation (SDE)

An Indium implant marker was used as an indicator of the presence of EOR defects, as indium ions behaves to segregate into EOR dislocation loops during annealing. The HEAVY INDIUM (In) DOSE was about $1 \times 10^{14}$ cm$^{-2}$ The As Source Drain Implantation was at dose of 1.5E15 and an energy of 2 Kev.

Embodiment's Carbon Containing Layer Reduces Defects with Low T Anneal

Figure 9A:
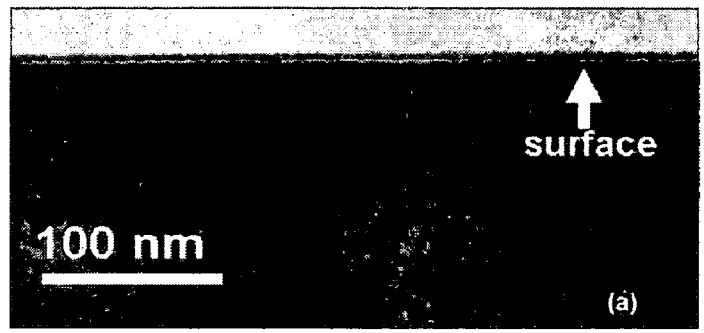
FIGS. 9A and 9B are XTEM Images showing samples prepared after annealing at RTP 650° C. for 20 sec according to example embodiments.
Figure 9B:
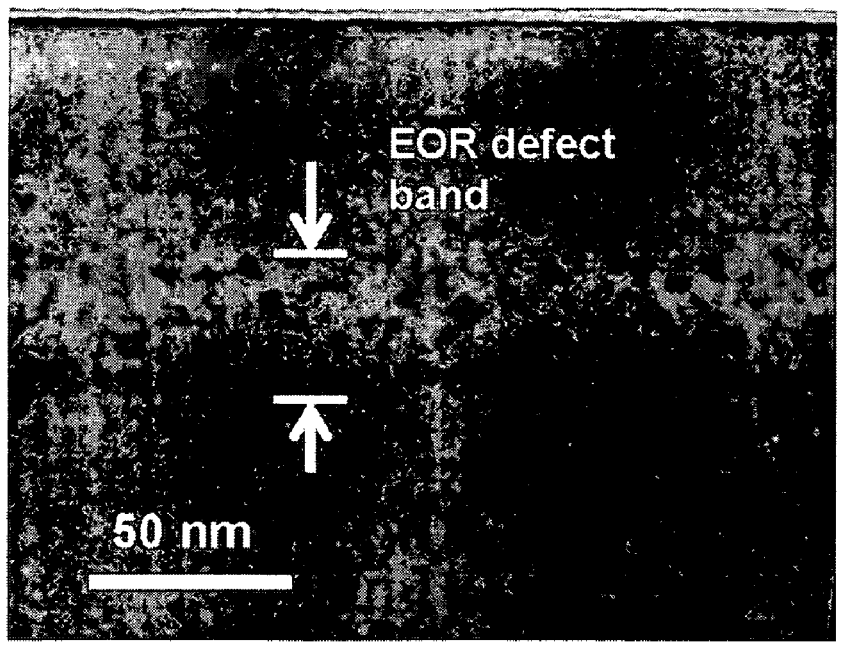

FIGS. 9A and 9B are XTEM Images showing samples prepared after annealing at RTP 650° C. for 20 sec.

FIG. 9A-(a.) shows substantial elimination of the EOR defect band with the presence of ~0.5% of substitutional carbon grown specifically at the implantation EOR range region in the silicon substrate.

FIG. 9B-(b.) sample annealed without presence of carbon. The EOR defect band is clearly visible. For both images, no visible defect band was found corresponding to the SDE implantation.

Figure 9C:
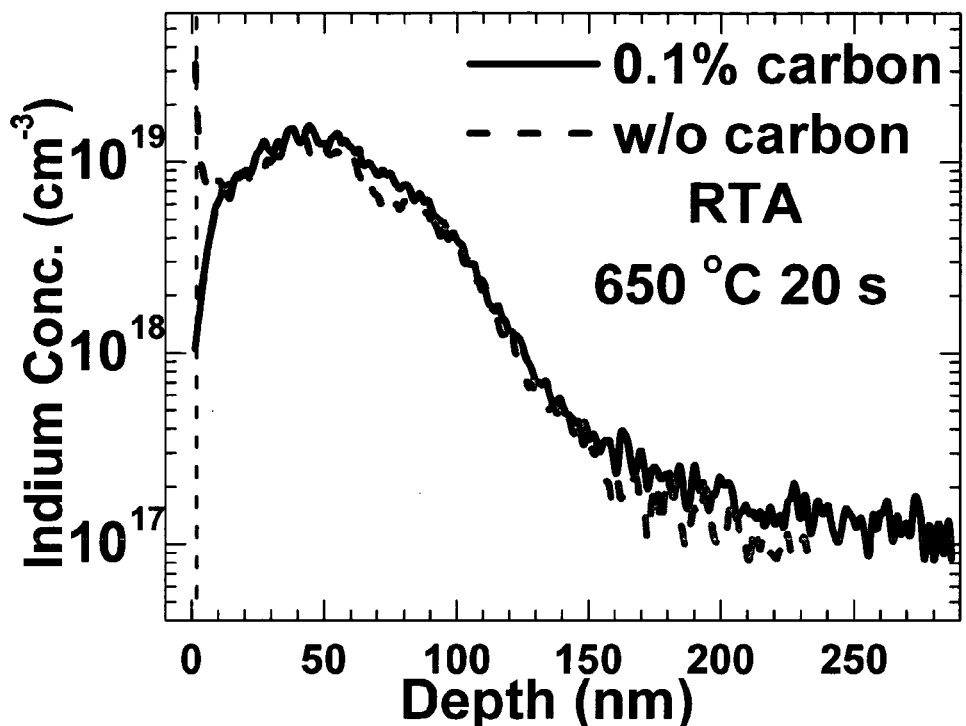
FIG. 9C illustrates the TOF- SIMS measurement performed on samples with and without the embodiments C-containing layer.

Referring to FIG. 9C, the TOF-SIMS measurement performed on the indium ion showed subtle segregation of indium into EOR peaks at the given annealing conditions is sample without carbon incorporation, indicating the presence of defects.

Embodiment's Carbon Containing Layer Reduces Defects with Higher T Anneal

Figure 9D:
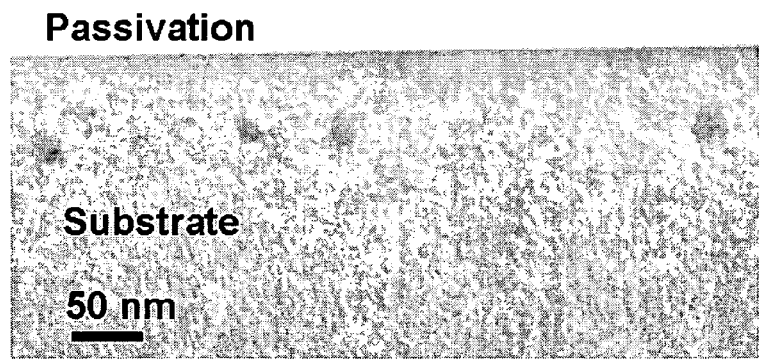
FIG. 9D is an XTEM image that shows the presence of EOR dislocations in the sample without the incorporation of carbon.
Figure 9E:
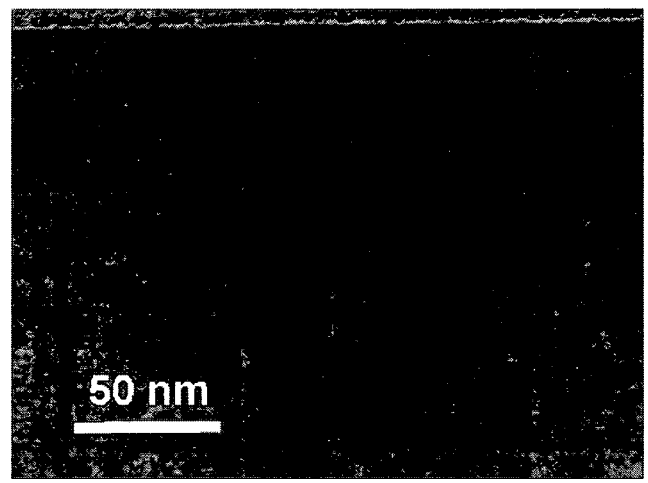
FIG. 9E is an XTEM image showing the absence of EOR defect band with the presence of the embodiment's substitutional carbon layer for 0.1% carbon incorporation subjected to spike annealing temperature of 1050° C.

At substantially even higher annealing conditions, no indication of EOR loops was observed. FIGS. 9D and 9E, are XTEM images.

FIG. 9D shows the presence of EOR dislocations without the incorporation of carbon.

FIG. 9E shows the absence of EOR defect band with the presence of the embodiment's substitutional carbon layer for 0.1% carbon incorporation subjected to spike annealing temperature of 1050° C.

Figure 9F:
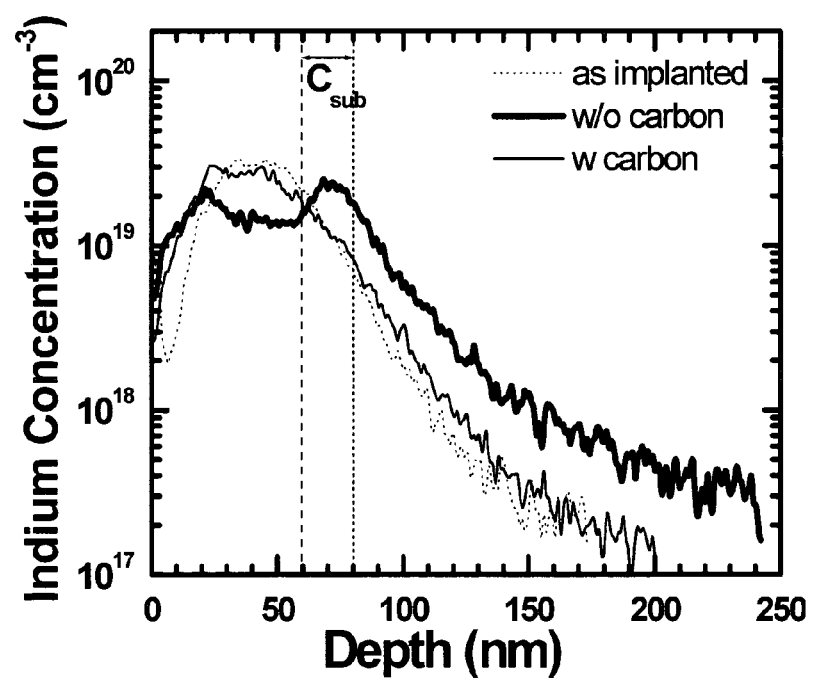
FIG. 9F shows SIMS measurements of indium ion for samples with and without the c-containing layer.

FIG. 9F shows SIMS measurements performed on the indium ion for samples with and without the c-containing layer.

The two experimental results suggest with the presence of carbon; the absence of clustering of silicon interstitials for EOR defect formation is achieved through the entire annealing process, indicating no need for the typical high temperature annealing step.

There is also no defect corresponding to the low energy implantation caused by the SD implant. This is possibly due to the surface enhancement effect where the silicon surface is an effective sink for silicon interstitials, preventing EOR dislocation loops from being formed.

Electrical Data

Figure 9G:
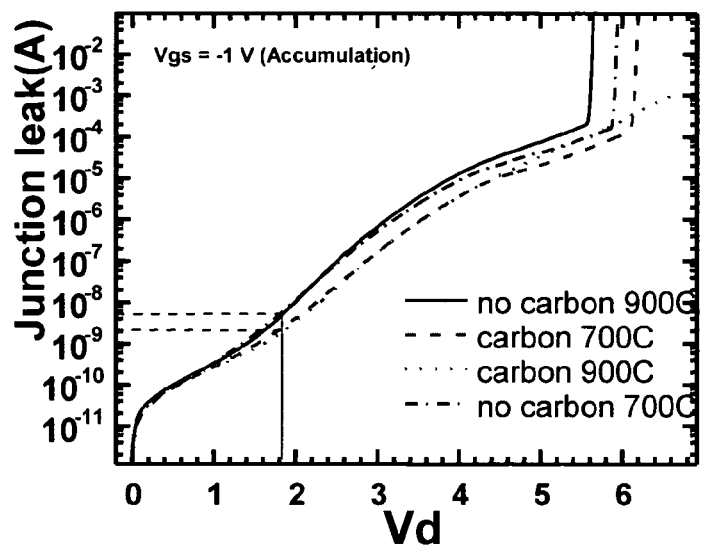
FIG. 9G, shows a graph comparing the junction leakage of a diode with and without the embodiment's carbon containing layer ($Si_{1-y}C_y$).

FIG. 9G, shows a graph comparing the junction leakage of a diode with and without the embodiment's carbon containing layer ($Si_{1-y}C_y$). The embodiments C-containing layer with an anneal in the range of 700° to 900°, has significantly lower junction leakage than the other processes.

Figure 9H:
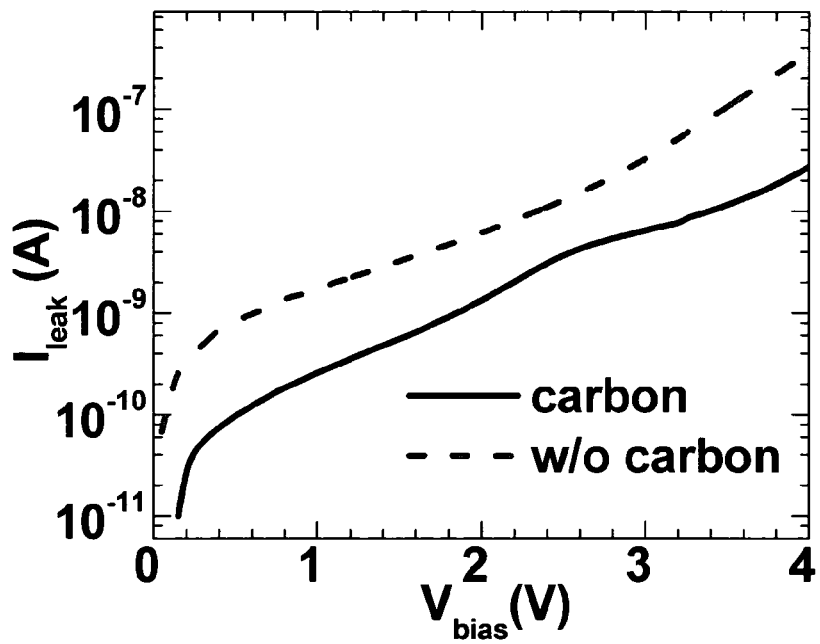
FIG. 9H shows a graph of $I_{leak}$ v $V_{bias}$ for a FET with a carbon-containing layer and without.

FIG. 9H shows a graph of $I_{leak}$ v $V_{bias}$ for a FET with a carbon-containing layer and without. The graph shows the embodiment's carbon-containing layer significantly improves leakage.

XII. NON-LIMITING EMBODIMENTS

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention.

Given the variety of embodiments of the present invention, the above description and illustrations should not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method to form first and second regions and a carbon containing layer using implantation processes in a substrate comprising:
   a) forming a carbon containing layer in a substrate; said carbon containing layer has a carbon concentration between 5E18 and 1E20 atom/cc;
   b) implanting ions to form a first region and a first end-of-range region in the substrate;
      (1) at least a portion of said first end-of-range region is in said carbon containing layer,
   said first end-of-range region is at least at a depth between 1.0*Rp-first region and 1.5*Rp-first region;
   c) implanting ions to form a second region and a second end-of-range region in the substrate;
      (1) at least a portion of said second region end-of-range region is in said carbon containing layer; said carbon containing layer extends at least from the 1.0 * Rp of the first region to 1.5*Rp of the second region;
   step b and step c are two separate different implant steps.

2. The method of claim 1 wherein said carbon containing layer is formed by a growth process; said substrate comprised of crystalline structure including silicon.

3. The method of claim 1 wherein said carbon containing layer is formed by implanting carbon ions into said substrate.

4. The method of claim 1 wherein said carbon containing layer has a carbon concentration between 1E19 and 2E19 atom/cc.

5. The method of claim 1 wherein said carbon containing layer is comprised of $Si_{1-y}C_y$ alloy with y between about 0.001 and 0.005.

6. The method of claim 1 which further includes: said second region is deeper than said first region.

7. The method of claim 1 which further includes: said carbon containing layer extends from the top of the first end-of-range region to at least the bottom of said second end-of-range region.

8. The method of claim 1 wherein said second end-of-range region is at least at a depth between 1.0*Rp-first region and 1.5*Rp-first region.

9. The method of claim 1 which further includes: annealing said substrate whereby the carbon containing layer acts as a sink for defects;
(1) the anneal performed at a temperature between 650 and 850 degrees C. and for a time between 1 and 60 seconds;
(2) said carbon containing layer extends at least from the projected range the first region to the bottom of the second end-of-range region.

10. The method of claim 1 wherein said first region is a pocket region and said second region is a source/drain region and a transistor is comprised of said first and said second regions.

11. A method to form a low temperature MOSFET using a carbon doped region comprising:
a) forming a carbon containing layer in or on a substrate; said substrate comprised of a crystalline silicon;
b) forming a gate structure over said substrate; a channel region in said substrate under said gate structure;
c) implanting ions to form pocket regions and pocket EOR regions;
(1) said pocket regions at least partially in said substrate and said carbon containing layer,
(2) said pocket EOR regions have a depth at least between $1.0*Rp^{pocket}$ and $1.5*Rp^{pocket}$;
(3) said pocket EOR regions in said carbon containing layer,
d) forming S/D extension regions in said substrate adjacent said gate structure;
e) forming spacers on the sidewalls of said gate structure,
f) implanting ions to form source/drain regions and source/drain end-of-range regions in said substrate adjacent said gate structure;
(1) said source/drain regions formed by an ion implant process where the source/drain end-of-range regions are within said carbon containing layer,
g) annealing said substrate whereby the carbon containing layer acts as a sink for defects.

12. The method of claim 11 wherein said substrate is comprised of a lower strained region and an upper silicon cap; said lower strain region is comprised of $Si_{1-y}Ge_y$ or $Si_{1-y}C_y$ where y is between 0.1 and 0.3.

13. The method of claim 11 wherein said carbon containing layer is grown using an epitaxy process on the surface of said substrate; said carbon containing layer diffuses up into the Si layer and down into the substrate during subsequent heat processes so that the carbon contain layer has a retro grade profile.

14. The method of claim 11 wherein said carbon containing layer is formed by implanting carbon ions into said substrate and said carbon containing layer has a carbon concentration between 5E18 and 1E20 atom/cc.

15. The method of claim 11 wherein said carbon containing layer has a carbon concentration between 1E19 and 2E19 atom/cc.

16. The method of claim 11 wherein said carbon containing layer is comprised of $Si_{1-y}C_y$ alloy with y between about 0.001 and 0.005.

17. The method of claim 11 wherein said pocket EOR region has a depth between $1.0*Rp^{pocket}$ and $2.0*Rp^{pocket}$.

18. The method of claim 11 wherein carbon containing layer extends at least from the pocket projected range to the bottom of the source/drain end-of-range region.

19. The method of claim 11 wherein said source/drain EOR region is located at least between the depths of $1.0*Rp^{SD}$ and $1.5*Rp^{SD}$; and said carbon containing layer extends between 1.0 and 2.0 times the depth of the projected range of the source and drain regions.

20. The method of claim 11 wherein the anneal is performed at a temperature between 650 and 850 degrees C. and for a time between 1 and 60 seconds.

21. The method of claim 11 wherein said carbon containing layer extends at least from the projected range (Rp) of the SDE range region to the bottom of the source/drain end-of-range region.

22. The method of claim 11 wherein substantially all of said channel region is not in said carbon containing layer.

23. A method to form a low temperature MOSFET using a carbon doped region comprising:
a) forming a carbon containing layer on a substrate; said substrate comprised of a crystalline silicon;
(1) said carbon containing layer formed by a growth method selected from chemical vapor deposition or epitaxy growth;
b) forming a silicon layer over said carbon containing layer,
c) forming a gate structure on said silicon layer, a channel region in said silicon layer under said gate structure;
d) implanting ions to form pocket regions and pocket EOR regions in said substrate;
(1) said pocket regions at least partially in said substrate and at least partially in said carbon containing layer;
e) forming S/D extension regions in said silicon epitaxy layer adjacent said gate structure;
f) forming spacers on the sidewalls of said gate structure;
g) implanting ions to form source/drain regions and source/drain EOR regions in said silicon layer adjacent said gate structure;
(1) said source/drain regions formed by an ion implant process where said source/drain EOR regions are within said carbon containing layer;
h) annealing said substrate whereby the carbon containing layer acts as a sink for defects from the pocket implant and source/drain implant.

24. The method of claim 23 herein said carbon containing layer has a carbon concentration between 5E18 and 1E20 atom/cc.

25. The method of claim 23 wherein said carbon containing layer is comprised of $Si_{1-y}C_y$ alloy with y between about 0.001 and 0.005.

26. The method of claim 23 wherein the step of: forming a silicon layer over said carbon containing layer, further comprises: said silicon layer is comprised of a silicon epitaxy layer, and
said silicon layer has a thickness between 200 and 500 Å.

27. The method of claim 23 wherein said silicon layer is comprised of a lower strained region and a upper silicon cap; said lower strain region is comprised of $Si_{1-y}Ge_y$ or $Si_{1-y}C_y$ where y is between 0.01 and 0.3.

28. The method of claim 23 wherein said pocket regions have a projected region with a depth in the range of between the $Rp^{SDE}$ and $Rp^{SD}$; and said pocket EOR region has a depth between $1.0\,Rp^{pocket}$ and $2.0\,Rp^{pocket}$.

29. The method of claim 23 wherein said pocket EOR regions are in said carbon containing layer, said channel region is not in said carbon containing layer, said source/drain EOR regions are located at least between the depths of $Rp^{SD}$ and $1.5*Rp^{SD}$.

30. The method of claim 23 wherein carbon containing layer extends at least from the projected range of the S/D extension regions to the bottom of the source/drain end-of-range regions.

31. The method of claim 23 wherein said carbon containing layer extends between 1.0 and 2.0 times the depth of the projected range of the source and drain regions.

32. The method of claim 23 wherein said carbon containing layer extends at least from the projected range of the SDE regions to the bottom of the source/drain end-of-range regions.

33. A method to form a low temperature MOSFET using a carbon doped region comprising:
 a) forming a strained region over the substrate;
 b) forming a carbon containing layer over the strained region;
 c) forming a silicon cap layer over said carbon containing layer,
 d) forming a gate structure over said substrate; a channel region under said gate structure;
 e) implanting ions to form pocket regions, and pocket EOR regions in said substrate structure;
  (1) said pocket regions at least partially in said substrate and said carbon containing layer,
  (2) said pocket EOR regions in said carbon containing layer,
 f) forming S/D extension regions in said substrate adjacent said gate structure;
 g) forming spacers on the sidewalls of said gate structure;
 h) implanting ions to form source/drain regions and source/drain end-of-Range regions in said substrate structure adjacent said gate structure;
  (1) said source/drain regions formed by an ion implant process where the source/drain end-of-range regions are within said carbon containing layer,
 i) annealing said substrate whereby the carbon containing layer acts as a sink for defects.

34. The method of claim 33 wherein said carbon containing layer extends at least from the projected range of the SDE range region to the bottom of the source/drain end-of-range region.

35. The method of claim 33 wherein the carbon containing layer is deposited or grow along with the strained region.

36. The method of claim 33 wherein said strain region is comprised of $Si_{1-y}Ge_y$ or $Si_{1-y}C_y$ where y is between 0.1 and 0.3.

37. The method of claim 33 wherein the strained region is comprised of $Si_{1-y}Ge_y$ or $Si_{1-x}C_x$ where x is between about 1 and 10%.

38. The method of claim 33 wherein the strained region has a thickness of between 0.8 μm to 1.2 μm.

39. The method of claim 33 wherein said carbon containing layer has a carbon concentration between 5E18 and 1E20 atom/cc.

40. A method for forming implanted C-regions in a semiconductor device comprising the steps of:
 a) forming a gate structure on said silicon layer, a channel region in a substrate under said gate structure;
 b) implanting ions to form pocket regions and pocket EOR regions in said substrate;
 c) implanting C ions into said substrate in said pocket EOR regions to form carbon-containing pocket EOR regions; said pocket EOR regions in said carbon-containing pocket EOR regions;
 d) forming SDE regions and SDE EOR regions in said substrate adjacent said gate structure;
 e) implanting C ions into said substrate in said SDE EOR regions to form carbon-containing SDE EOR regions; said SDE EOR regions in said carbon-containing SDE EOR regions;
 f) forming spacers on the sidewalls of said gate structure;
 g) forming source/drain regions and source/drain EOR regions in said substrate under said gate structure;
 h) implanting C ions into said substrate in said source/drain end-of-range regions to form carbon-containing source/drain EOR regions; said source/drain end-of-range regions in said carbon-containing source/drain EOR regions;
  (1) said carbon-containing source/drain EOR regions have a carbon concentration between 5E18 and 1E20 atom/cc; and
  (2) said carbon-containing source/drain EOR regions are positioned at a depth between 1.0 times the depth of the projected range of the source-drain regions and 2.0 times the depth of the projected range of the source-drain regions;
 i) annealing said substrate whereby the carbon containing layers act as a sink for defects from the pocket implant, the SDE implant and source/drain implant;
  (1) the projected range and end-or-range regions for the pocket implant, the SDE implant and the source/drain implant are in the carbon containing layers.

41. The method of claim 40 wherein the anneal performed at a temperature between 650 and 850 degrees C. and for a time between 1 and 60 seconds.

42. The method of claim 40 wherein said carbon-containing pocket EOR regions have a carbon concentration 5E18 and 1E20 atom/cc; said carbon-containing pocket EOR regions are positioned at a depth between 1.0 times the depth of the projected range of the pocket implant and 2.0 times the depth of the projected range of the pocket implant regions; said carbon-containing SDE EOR regions have a carbon concentration between 5E18 and 1E20 atom/cc.

43. The method of claim 40 wherein said carbon-containing SDE EOR regions ares positioned at a depth between 1.0 times the depth of the projected range of the SDE regions and 2.0 times the depth of the projected range of the SDE regions.

44. A method for forming implanted C-regions in a semiconductor device comprising the steps of:
 a) forming a gate structure on a substrate; a channel region in said substrate under said gate structure;
 b) implanting dopant ions to form pocket regions and pocket EOR regions in said substrate;
 c) implanting C ions into said substrate in said pocket EOR regions to form carbon-containing pocket EOR regions; said pocket EOR regions are in said carbon-containing pocket EOR regions; steps b) and c) are distinct implant steps;
said carbon-containing pocket EOR regions have a carbon concentration between 5E18 and 1E20 atom/cc;
 d) forming SDE regions and SDE EOR regions in said substrate adjacent said gate structure;
 e) forming spacers on the sidewalls of said gate structure;
 f) forming source/drain regions and source/drain end-of-range regions in said substrate under said gate structure;
 g) annealing said substrate whereby the carbon containing layers act as a sink for defects.

45. The method of claim 44 wherein said carbon-containing pocket EOR regions are positioned at a depth between 1.0 times the depth of the projected range of the pocket implant and 2.0 times the depth of the projected range of the pocket implant.

46. A method for forming implanted C-regions in a semiconductor device comprising the steps of:
 a) forming a gate structure on a substrate; a channel region in said substrate under said gate structure;
 b) implanting ions to form pocket regions and pocket EOR regions in said substrate;
 c) forming SDE regions and SDE EOR regions in said substrate adjacent said gate structure;
 d) implanting C ions into said substrate in said SDE EOR regions to form carbon-containing SDE EOR regions; said SDE EOR regions in said carbon-containing SDE EOR regions; said carbon-containing SDE EOR regions are positioned at a depth between 1.0 times the depth of the projected range of the SDE regions and 2.0 times the depth of the projected range of the SDE regions; said carbon containing SDE EOR regions have a carbon concentration between 5E18 and 1E20 atom/cc;
 e) forming spacers on the sidewalls of said gate structure;
 f) forming source/drain regions and source/drain end-of-range regions in said substrate under said gate structure;
 g) annealing said substrate whereby the carbon containing layers act as a sink for defects from the SDE implant.

47. A method for forming implanted C-regions in a semiconductor device comprising the steps of:
 a) forming a gate structure over a substrate; a channel region in said substrate under said gate structure;
 b) implanting ions to form pocket regions and pocket EOR regions in said substrate;
 c) forming SDE regions in said substrate adjacent said gate structure;
 d) forming spacers on the sidewalls of said gate structure;
 e) forming source/drain regions and source/drain EOR regions in said substrate under said gate structure;
 f) implanting C ions into said substrate in said source/drain EOR regions to form carbon-containing source/drain EOR regions; said source/drain EOR regions in said carbon-containing source/drain EOR regions;
  (1) said carbon-containing source/drain EOR regions have a carbon concentration between 5E18 and 1E20 atom/cc; and
  (2) said carbon-containing source/drain EOR regions are positioned at a depth between 1.0 times the depth of the projected range of the source-drain regions and 2.0 times the depth of the projected range of the source-drain regions;
 g) annealing said substrate whereby the carbon containing layers act as a sink for defects from the pocket implant, the SDE implant and source/drain implant.

48. The method of implanting a carbon-containing layer in the EOR region of a PAI implant for a SDE region comprising the steps of:
 a) forming a gate structure over a substrate;
 b) performing a PAI implant to implant a non-dopant to form PAI regions and PAI end-of-range regions;
 c) implanting C to form C-containing PAI layers; said PAI end-of-range regions are in said C-containing PAI layers; steps b) and c) are two separate and distinct implantations:
  said C-containing PAI layers have a carbon concentration between 5E18 and 1E20 atom/cc:
 d) performing a SDE implant to form SDE regions;
 e) annealing said substrate.

49. The method of claim 48 wherein the anneal is performed at a temperature less than 950° C.

* * * * *

UNITED STATES PATENT AND TRADEMARK OFFICE
CERTIFICATE OF CORRECTION

PATENT NO. : 7,169,675 B2  
APPLICATION NO. : 10/886442  
DATED : January 30, 2007  
INVENTOR(S) : Chung Foon Tan et al.

Page 1 of 1

It is certified that error appears in the above-identified patent and that said Letters Patent is hereby corrected as shown below:

Claim 1, col. 18, lines 49-50, "said second region end-of-range region" should read --said second end-of-range region--.

Claim 33, col. 21, line 17, "the substrate" should read -- a substrate--.

Claim 33, col. 21, line 25, "substrate structure" should read --substrate--.

Claim 33, col. 21, lines 34-35: "substrate structure" should read --substrate--.

Claim 37, col. 21, line 50, "regionis" should read --region is--.

Claim 40, col. 21, line 60, "said silicon layer" should read --a silicon layer--.

Claim 43, col. 22, line 41, "ares" should read --are--.

Claim 46, col. 23, line 17, "ofthe" should read --of the--.

Claim 46, col. 23, line 18, "ofthe" should read --of the--.

Signed and Sealed this

Third Day of July, 2007

JON W. DUDAS  
*Director of the United States Patent and Trademark Office*

UNITED STATES PATENT AND TRADEMARK OFFICE
CERTIFICATE OF CORRECTION

PATENT NO. : 7,169,675 B2  Page 1 of 1
APPLICATION NO. : 10/886442
DATED : January 30, 2007
INVENTOR(S) : Chung Foong Tan et al.

It is certified that error appears in the above-identified patent and that said Letters Patent is hereby corrected as shown below:

In claim 9, col. 19, line 15, after "range", insert --of--.
In claim 12, col. 19, line 48, "strain" should read --strained--.
In claim 13, col. 19, line 53, "the Si layer" should read -- a Si layer--.
In claim 13, col. 19, line 54, "contain" should read -- containing --.
In claim 17, col. 19, line 67, "region has" should read -- regions have--.
In claim 18, col. 20, line 1, after "wherein", insert -- the --.
In claim 18, col. 20, line 3, "region" should read -- regions--.
In claim 19, col. 20, line 5, "region is" should read -- regions are--.
In claim 19, col. 20, line 8, "source and drain" should read --source/drain--.
In claim 21, col. 20, line 14, "SDE range region" should read --SDE regions--.
In claim 21, col. 20, line 15, "region" should read --regions--.
In claim 23, col. 20, line 34, delete "epitaxy".
In claim 27, col. 20, line 60, "strain" should read --strained--.
In claim 28, col. 20, line 64, "region has" should read --regions have--.
In claim 30, col. 21, line 4, after "wherein", insert --the--.
In claim 34, col. 21, line 43, "SDE range region" should read --SDE regions--.
In claim 34, col. 21, line 44, "region" should read "regions".
In claim 35, col. 21, line 46, "grow" should read -- grown--.
In claim 36, col. 21, line 47, "strain" should read --strained--.
In claim 40, col. 22, lines 20 and 22, "source-drain" should read --source/drain--.
In claim 40, col. 22, line 26, "end-or-range" should read --end-of-range--.
In claim 42, col. 22, line 33, after "concentration" insert --between--.
In claim 46, col. 23, line 19, "carbon containing" should read --carbon-containing--.
In claim 47, col. 24, lines 12 and 14, "source-drain" should read --source/drain--.

Signed and Sealed this

Thirtieth Day of October, 2007

JON W. DUDAS
*Director of the United States Patent and Trademark Office*